(12) United States Patent
Kim et al.

(10) Patent No.: US 11,711,640 B2
(45) Date of Patent: Jul. 25, 2023

(54) DISPLAY APPARATUS

(71) Applicant: LG Display Co., Ltd., Seoul (KR)

(72) Inventors: Taehyung Kim, Paju-si (KR); JaiHyuk Lee, Paju-si (KR); GyungBo Ha, Paju-si (KR); HakMo Hwang, Paju-si (KR); SunBok Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 108 days.

(21) Appl. No.: 17/379,294

(22) Filed: Jul. 19, 2021

(65) Prior Publication Data

US 2022/0030339 A1    Jan. 27, 2022

(30) Foreign Application Priority Data

Jul. 21, 2020  (KR) .................. 10-2020-0090311

(51) Int. Cl.
| | | |
|---|---|---|
| *H04R 1/02* | (2006.01) | |
| *H04R 17/00* | (2006.01) | |
| *H05K 1/02* | (2006.01) | |
| *H05K 1/14* | (2006.01) | |

(52) U.S. Cl.
CPC ............. *H04R 1/02* (2013.01); *H04R 17/00* (2013.01); *H05K 1/028* (2013.01); *H05K 1/147* (2013.01); *H04R 2499/15* (2013.01); *H05K 2201/10128* (2013.01)

(58) Field of Classification Search
CPC ...... H04R 1/02; H04R 17/00; H04R 2499/15; H04R 2201/025; H04R 1/025; H04R 7/045; H04R 17/10; H04R 1/24; H04R 7/04; H04R 1/2811; H04R 17/005; H05K 1/028; H05K 1/147; H05K 2201/10128; H04S 3/008; H04S 3/00; G09F 9/35; G09F 9/33

See application file for complete search history.

(56) References Cited

U.S. PATENT DOCUMENTS

| | | | |
|---|---|---|---|
| 7,565,949 B2 * | 7/2009 | Tojo ...................... | G06F 1/1605 |
| | | | 181/171 |
| 11,122,361 B2 * | 9/2021 | Son ....................... | H04R 1/403 |
| 2010/0201652 A1 * | 8/2010 | Caliskan ............. | H04M 1/0266 |
| | | | 345/177 |
| 2016/0324027 A1 * | 11/2016 | Ahn ..................... | H05K 1/147 |
| 2017/0324851 A1 * | 11/2017 | Iwabuchi ............ | B32B 3/08 |
| 2018/0198052 A1 * | 7/2018 | Park ..................... | G06F 1/1684 |
| 2019/0268681 A1 * | 8/2019 | Masuda ............... | G09F 9/00 |
| 2020/0059733 A1 | 2/2020 | Shin et al. | |
| 2020/0107088 A1 * | 4/2020 | Ahn ..................... | H04R 3/12 |
| 2020/0280807 A1 * | 9/2020 | Kim ..................... | H04R 1/028 |
| 2021/0048842 A1 * | 2/2021 | Choi .................... | H04R 7/045 |
| 2021/0289622 A1 * | 9/2021 | Hwangbo ............ | H05K 1/0296 |
| 2022/0413617 A1 * | 12/2022 | Ahn ..................... | G06F 1/1637 |

OTHER PUBLICATIONS

Office Action dated Jul. 28, 2022 issued in corresponding Japanese Patent Application No. 2021-116320.

\* cited by examiner

*Primary Examiner* — Oyesola C Ojo

(74) *Attorney, Agent, or Firm* — Morgan, Lewis & Bockius LLP

(57) ABSTRACT

A display apparatus includes a display panel configured to display an image, a circuit part including a printed circuit board disposed spaced apart from a first portion of the display panel and connected to the display panel, a first vibration device disposed at a rear surface of the display panel, and a second vibration device disposed at a rear surface of the printed circuit board.

38 Claims, 19 Drawing Sheets

DISPLAY APPARATUS

CROSS-REFERENCE TO RELATED APPLICATIONS

This application claims the benefit of the Korean Patent Application No. 10-2020-0090311 filed on Jul. 21, 2020, which is hereby incorporated by reference as if fully set forth herein.

BACKGROUND

Technical Field

The present disclosure relates to a display apparatus, and more particularly, to a display apparatus which vibrates a display panel to generate a sound.

Discussion of the Related Art

Display apparatuses are equipped in home electronic appliances or electronic products such as televisions (TVs), monitors, notebook computers, smartphones, tablet computers, electronic pads, wearable apparatuses, watch phones, portable information apparatuses, navigation apparatuses, or vehicle control display apparatuses and are used as a screen which displays an image.

The display apparatuses may include a display panel, which displays an image, and a sound device for outputting a sound associated with the image.

However, the display apparatuses have a limitation in outputting a realistic sound or a stereo sound of a multi-channel through the sound device, and due to this, have a problem where the immersion of a viewer is reduced.

SUMMARY

Therefore, the inventors have recognized the problems described above and have performed various experiments on a display apparatus where a sound travels in one or more directions of the display apparatus, thereby providing a surround sound environment. Through the various experiments, the inventors have invented a display apparatus having a new structure, which outputs a sound in one or more directions of the display apparatus by using, as a sound vibration plate, each of elements such as a display panel and a printed circuit board (PCB) connected to the display panel, included in the display apparatus.

Accordingly, embodiments of the present disclosure are directed to a display apparatus that substantially obviates one or more problems due to limitations and disadvantages of the related art.

An aspect of the present disclosure is to provide a display apparatus which outputs a sound by using elements included in the display apparatus.

Another aspect of the present disclosure is to provide a display apparatus which outputs a sound in one or more directions of the display apparatus by using elements included in the display apparatus.

Another aspect of the present disclosure is to provide a display apparatus in which a thickness of the display apparatus is reduced and a sound is output in one or more directions of the display apparatus, thereby providing a surround sound environment.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and in accordance with the purpose of the disclosure, as embodied and broadly described herein, a display apparatus comprises a display panel configured to display an image, a circuit part including a printed circuit board disposed spaced apart from a first portion of the display panel and connected to the display panel, a first vibration device disposed at a rear surface of the display panel, and a second vibration device disposed at a rear surface of the printed circuit board.

A display apparatus according to embodiments of the present disclosure may output a sound in one or more directions of the display apparatus, and thus, a user may watch an image in a surround sound environment, thereby increasing the immersion of the user.

A display apparatus according to embodiments of the present disclosure may output a sound in one or more directions of the display apparatus by using the elements included in the display apparatus, thereby providing the surround sound environment and decreasing a thickness of the display apparatus.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
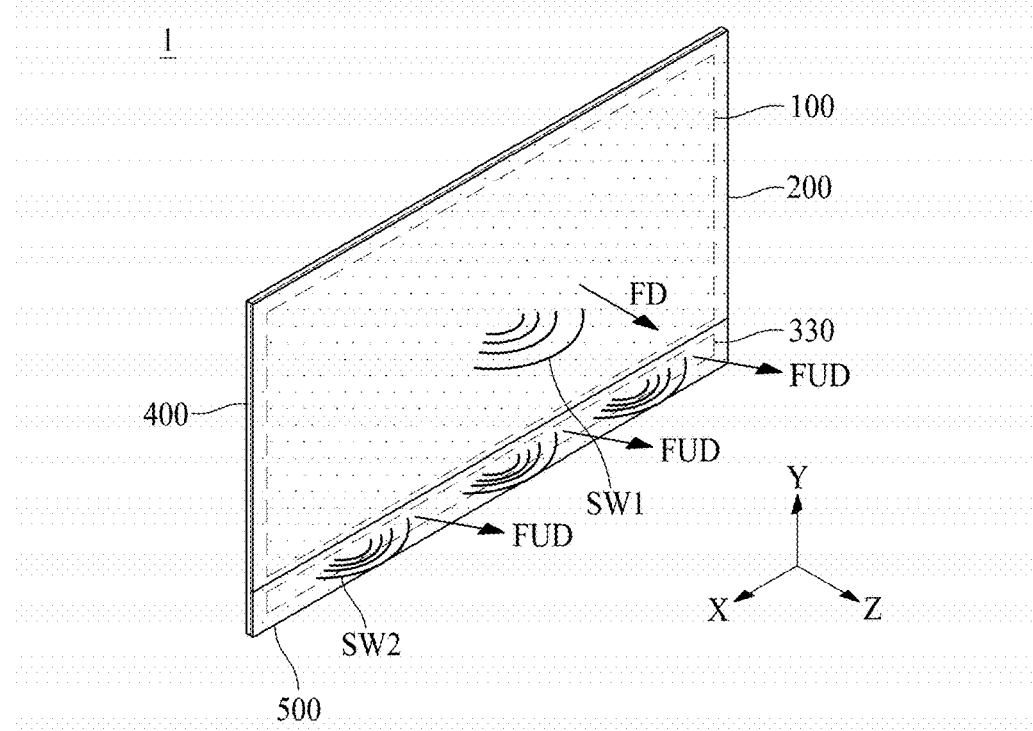
FIG. 1 illustrates a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example, however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element. In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified.

In the present disclosure, examples of a display apparatus may include a narrow-sense display apparatus such as an organic light emitting display (OLED) module or a liquid crystal module (LCM) including a display panel and a driver for driving the display panel. Also, examples of the display apparatus may include a set device (or a set apparatus) or a set electronic device such as a notebook computer, a TV, a computer monitor, an equipment apparatus including an automotive apparatus or another type apparatus for vehicles, or a mobile electronic device such as a smartphone or an electronic pad, which is a complete product (or a final product) including an LCM or an OLED module.

Therefore, in the present disclosure, examples of the display apparatus may include a narrow-sense display apparatus itself, such as an LCM or an OLED module, and a set apparatus which is a final consumer device or an application product including the LCM or the OLED module.

In some embodiments, an LCM or an OLED module including a display panel and a driver may be referred to as a narrow-sense display apparatus, and an electronic apparatus which is a final product including an LCM or an OLED module may be referred to as a set apparatus. For example, the narrow-sense display apparatus may include a display panel, such as an LCD or an OLED, and a source printed circuit board (PCB) which is a controller for driving the display panel. The set apparatus may further include a set PCB which is a set controller electrically connected to the source PCB to overall control the set apparatus.

A display panel applied to an embodiment of the present disclosure may use all types of display panels such as a liquid crystal display panel, an organic light emitting diode (OLED) display panel, and an electroluminescent display panel, but embodiments are not limited to a specific display panel which is vibrated by a vibration device according to an embodiment of the present disclosure to output a sound. Also, a shape or a size of a display panel applied to a display apparatus according to an embodiment of the present disclosure is not limited.

For example, if the display panel is the liquid crystal display panel, the display panel may include a plurality of gate lines, a plurality of data lines, and a plurality of pixels respectively provided at a plurality of pixel areas defined by intersections of the gate lines and the data lines. Also, the display panel may include an array substrate including a thin film transistor (TFT) which is a switching element for adjusting a light transmittance of the plurality of pixels, an upper substrate including a color filter and/or a black matrix, and a liquid crystal layer between the array substrate and the upper substrate.

When the display panel is the organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT which is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, a light emitting layer, or the like). As another example, the layer provided on the array substrate may include a micro light emitting diode.

The display panel may further include a backing such as a metal plate attached on the display panel. However, embodiments are not limited to the metal plate, and the display panel may include another structure made of different materials instead of the metal plate.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

Hereinafter, a display apparatus according to the present disclosure will be described in detail with reference to the accompanying drawings.

Figure 2:
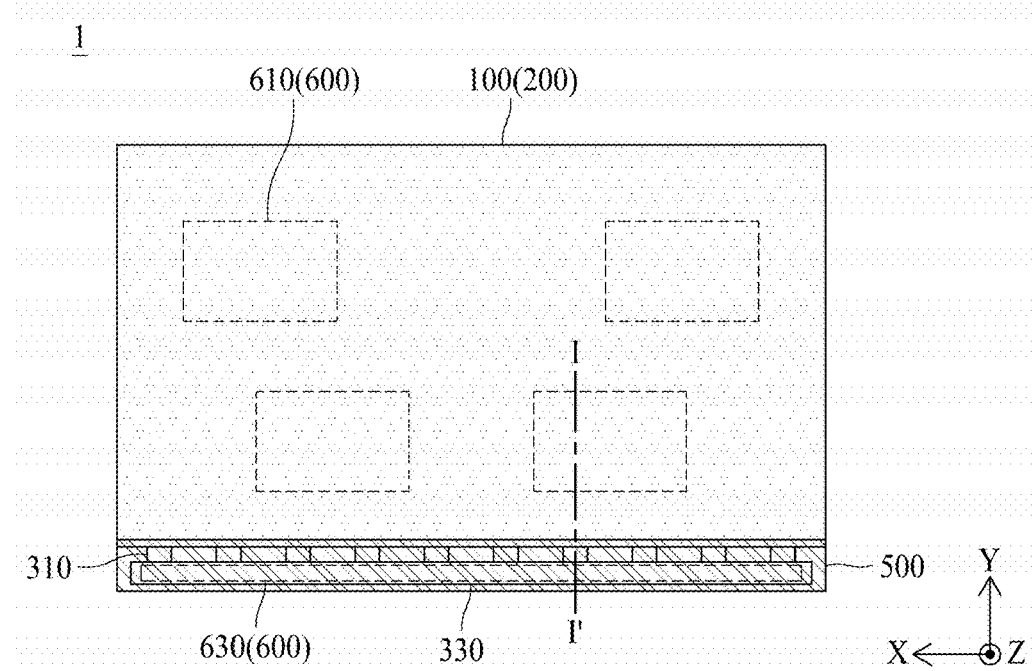
FIG. 2 is a plan view illustrating a front surface of the display apparatus illustrated in FIG. 1.
Figure 3:
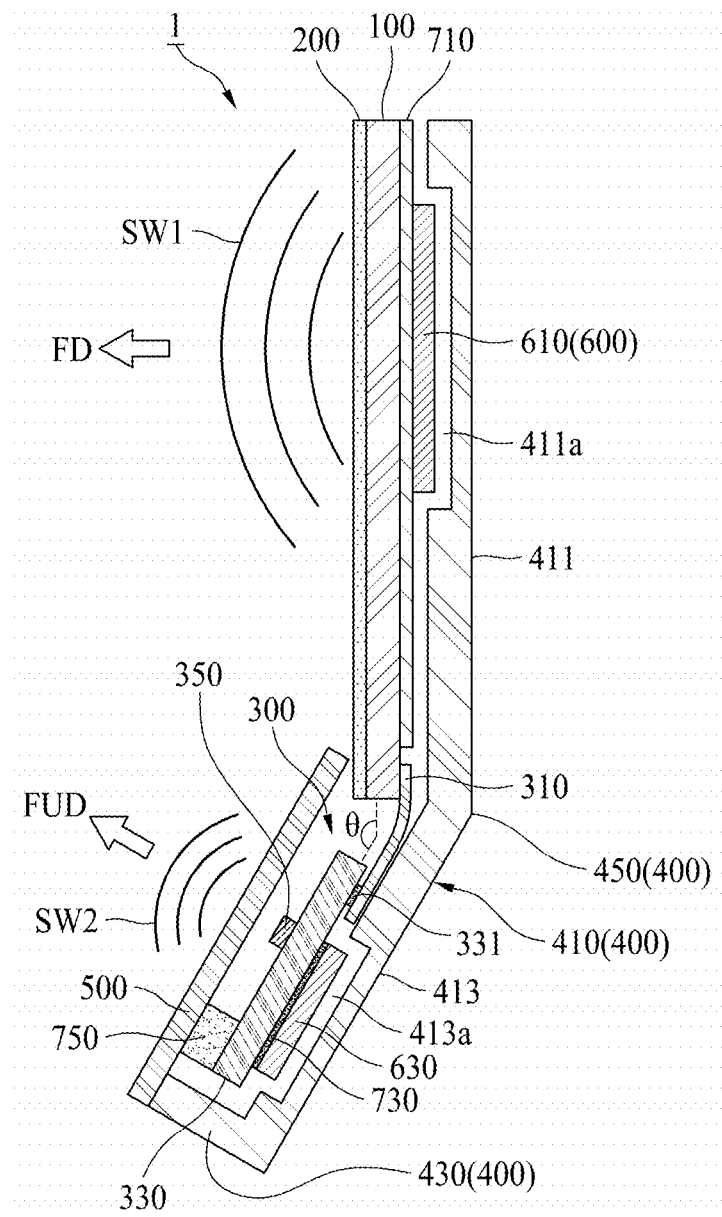
FIG. 3 is a cross-sectional view taken along line I-I' illustrated in FIG. 2.

FIG. 1 illustrates a display apparatus according to an embodiment of the present disclosure, FIG. 2 is a plan view illustrating a front surface of the display apparatus illustrated in FIG. 1, and FIG. 3 is a cross-sectional view taken along line I-I' illustrated in FIG. 3.

With reference to FIGS. 1 to 3, the display apparatus 1 according to an embodiment of the present disclosure may output a sound SW in one or more directions thereof based on vibrations of elements included in the display apparatus 1. For example, the display apparatus 1 may output a first sound SW1 in a forward direction FD of the display panel 100 and may output a second sound SW2 in a forward-upward direction FUD of the display panel 100 (a direction which faces a front region with respect to the display panel 100 and is upward diagonal to the display panel 100).

For example, the display apparatus 1 may output the first sound SW1 which is generated by using the display panel 100 as a vibration plate for generating a sound and may output the second sound SW2 which is generated by using a printed circuit board (PCB) 330 as a vibration plate for generating a sound. According to an embodiment of the present disclosure, the display apparatus 1 may simultaneously or sequentially output the first and second sounds SW1 and SW2.

Therefore, the display apparatus 1 according to an embodiment of the present disclosure may output the sound SW in one or more directions thereof, and thus, a user (a viewer or a listener) may watch an image in a surround sound environment, thereby enhancing the immersion of the user.

The display apparatus 1 according to an embodiment of the present disclosure may include a display panel 100, a first member 400, a panel driving circuit part 300, a second member 500, a third member 200, and a vibration apparatus 600. For example, the display apparatus 1 may include one or more vibration apparatuses 600. For example, the one or more vibration apparatuses 600 may include one or more first vibration devices 610 or one or more second vibration devices 630. The one or more vibration apparatuses 600 may include one or more vibration devices, and but the number of vibration devices is not limited thereto. For example, a vibration apparatus may be used as a vibration device.

The display panel 100 may display an image, for example, an electronic image or a digital image. For example, the display panel 100 may output light to display an image.

The display panel 100 may vibrate based on a vibration of the first vibration device 610 disposed at a rear surface of the display panel 100 to generate the first sound SW1 in the forward direction FD of the display panel 100. For example, the display panel 100 may generate a first sound SW1 having a first pitched sound band, and the first sound SW1 of the first pitched sound band may have one or more frequencies having a low-pitched sound band, a middle-low-pitched sound band, a middle-high-pitched sound band, and a high-pitched sound band. In a case where the display panel 100 is vibrated by a plurality of first vibration devices 610 to generate the first sound SW1, the display panel 100 may generate the first sound SW1 having frequencies of different pitched sound bands capable of being subdivided in the first pitched sound band for each region, based on vibrations of the plurality of first vibration devices 610.

According an embodiment of the present disclosure, the display panel 100 may be a curved display panel, or may be any type of display panel, such as a liquid crystal display panel, an organic light-emitting display panel, a quantum dot light-emitting display panel, a micro light-emitting diode display panel, an electrophoresis display panel, and an electro-wetting display panel. According another embodiment of the present disclosure, the display panel 100 may a flexible display panel. For example, the display panel 100 may a flexible liquid crystal display panel, a flexible organic light-emitting display panel, a flexible quantum dot light-emitting display, a flexible micro light emitting diode display panel, a flexible electrophoretic display panel, or a flexible electro-wetting display panel, but embodiments of the present disclosure are not limited thereto. According to another embodiment of the present disclosure, the display panel 100 may be a display panel with integrated touch panel. For example, the display panel with integrated touch panel may include a touch panel attached on a display panel, or may include a touch electrode layer disposed at the display panel.

The display panel 100 according to an embodiment of the present disclosure may include a display area, which displays an image based on driving of a plurality of pixels arranged on a substrate, and a non-display area which surrounds the display area. For example, the display panel 100 may be implemented so that an entire front surface of the substrate is implemented as the display area without the non-display area, in case of a non-bezel (or bezel-less) structure. For example, the display panel 100 may be a transparent display panel which includes a light transmission portion disposed at at least one of the plurality of pixels.

The display panel 100 according to an embodiment of the present disclosure may include a pixel array layer (or a display unit) configured to include an anode electrode, a cathode electrode, and a light emitting device layer. The display panel 100 may be configured to display an image in a type such as a top emission type, a bottom emission type, or a dual emission type, based on a structure of the pixel array layer. For example, in the top emission type, an image may be displayed by outputting visible light generated from the pixel array layer to the forward region in a front portion of a base substrate of the display panel 100. In the bottom emission type, an image may be displayed by outputting visible light generated from the pixel array layer to the backward region in a rear portion of a base substrate of the display panel 100.

For example, the light emitting device layer may include an organic light emitting layer or a micro light emitting diode device which is connected to each of the anode electrode and the cathode electrode. The micro light emitting diode device may be a light emitting diode implemented as an integrated circuit (IC) or chip type and may include a first terminal electrically connected to the anode electrode and a second terminal electrically connected to the cathode electrode. The cathode electrode may be connected to a light emitting device of a light emitting device layer provided at each pixel area in common.

The display panel 100 according to an embodiment of the present disclosure may include a bending portion that may be bent or curved to have a curved shape or a certain curvature radius.

The bending portion of the display panel 100 may be implemented in at least one of one periphery (or an edge) and the other periphery of the display panel 100, which are parallel to each other. The one periphery and/or the other periphery, where the bending portion is implemented, of the display panel 100 may include only the non-display area, or may include both the non-display area and a periphery (or an edge) of the display area. For example, the display panel 100 including the bending portion implemented by bending of the non-display area may have a one-side bezel bending structure or a both-side bezel bending structure. Also, the display panel 100 including the bending portion implemented by bending of the periphery (or the edge) of the display area and the non-display area may have a one-side active bending structure or a both-side active bending structure.

The third member 200 may be disposed at the front surface of the display panel 100 by a bonding process using an adhesive member (or a transparent adhesive member). The adhesive member may include a pressure sensitive adhesive (PSA), an optically clear adhesive (OCA), or an optically clear resin (OCR), but is not limited thereto.

The third member 200 according to an embodiment of the present disclosure may include a transparent plastic material, a glass material, or a tempered glass material. For example, the third member 200 may include one of sapphire glass and gorilla glass or a stacked structure thereof. As another example, the third member 200 may include a transparent plastic material such as polyethyleneterephthalate (PET). The third member 200 may include tempered glass based on a scratch resistance and transparency. For example, the third member 200 may be referred to as a front member, a front structure, a front window, a cover window, a glass window, a cover screen, a screen cover, or a window glass, but embodiments of the present disclosure are not limited thereto.

The third member 200 may configure a foremost structure of the display apparatus 1. For example, the third member 200 may protect a screen of the display panel 100. The third member 200 may be disposed at a front surface of the display panel 100. For example, the third member 200 may cover the front surface of the display panel 100, thereby protecting the display panel 100 from an external impact. Also, the third member 200 may vibrate along with a vibration of the display panel 100 to generate the first sound SW1.

For example, the third member 200 may include a transparent region, which overlaps a display area of the display panel 100, and a light blocking region which overlaps a non-display area of the display panel 100. The light blocking region may cover a non-display area, which does not display an image, of the display apparatus 1 as well as the non-display area of the display panel 100. The third member 200 according to an embodiment of the present disclosure may have a polygonal shape, including a rectangular shape or a square shape, or a non-polygonal shape including at least one or more sides having a curve shape.

The panel driving circuit part 300 may be disposed between the display panel 100 and the first member 400 and between the first member 400 and the second member 500. The panel driving circuit part 300 may be connected to the display panel 100. For example, the panel driving circuit part 300 may be disposed spaced apart from one side of the display panel 100 by a certain interval and may be connected to a pad part provided at a first periphery portion (or one periphery portion) of the display panel 100. The panel driving circuit part 300 may be implemented to display an image in a plurality of pixels disposed at the display panel 100.

The panel driving circuit part 300 according to an embodiment of the present disclosure may include at least one or more flexible circuit films 310, a printed circuit board (PCB) 330, and a driving control circuit part 350. For example, the flexible circuit film 310 may be referred to as other terms such as a chip-on film (COF), flexible printed circuit (FPC), a COF circuit, and a chip-on flexible printed circuit.

One side of each of the at least one or more flexible circuit films 310 may be connected to the pad part provided at the first periphery portion (or the one periphery portion) of the display panel 100. A plurality of pad parts may be arranged by a certain interval in a first direction (or an X-axis direction). Each of the at least one or more flexible circuit films 310 may be respectively connected to the plurality of pad parts having a certain interval therebetween, and thus, may be arranged at a certain interval in the first direction (or the X-axis direction). For example, one side of each of the at least one or more flexible circuit films 310 may be disposed at (or connected to) the pad part provided at the display panel 100 through a film attachment process using an anisotropic conductive film.

The other side of each of the at least one or more flexible circuit films 310 may be connected to one side of the PCB 330. For example, the at least one or more flexible circuit films 310 may be respectively connected to a plurality of terminals 331 provided at a first periphery portion (or one periphery portion) of the PCB 330. For example, the plurality of terminals 331 may be disposed at a surface (or a front surface), facing a front region with respect to the display apparatus 1, or a surface (or a rear surface or a backside surface) opposite to the front surface.

The PCB 330 may be connected to each of the at least one or more flexible circuit films 310 in common. The PCB 330 according to an embodiment of the present disclosure may include the plurality of terminals 331 provided at the first periphery portion thereof, and the other side of each of the at least one or more flexible circuit films 310 may be disposed at (or connected to) the plurality of terminals 331 by a film attachment process using an anisotropic conductive film.

The PCB 330 according to an embodiment of the present disclosure may vibrate based on a vibration of the second vibration device 630 disposed at a rear surface of the PCB 330 to generate the second sound SW2. For example, the PCB 330 may generate a second sound SW2 having a second pitched sound band, and the second sound SW2 having the second pitched sound band may have one or more frequencies having the low-pitched sound band, the middle-low-pitched sound band, the middle-high-pitched sound band, and the high-pitched sound band. In a case where the PCB 330 is vibrated by a plurality of second vibration devices 630 to generate the second sound SW2, the PCB 330 may generate the second sound SW2 having frequencies of different pitched sound bands for each region, based on vibrations of the plurality of second vibration devices 630. According to an embodiment of the present disclosure, the PCB 330 may generate the second sound SW2 having a frequency of a pitched sound band which differs from that of the first sound SW1, or may generate the second sound SW2 having a frequency of a pitched sound band which is the same as that of the first sound SW1.

The PCB 330 according to an embodiment of the present disclosure may be spaced apart from the display panel 100 by a certain interval in a second direction Y and may be disposed at one side of the display panel 100 not to overlap the display panel 100. For example, the first periphery portion of the display panel 100 and the first periphery portion of the PCB 330 may be spaced apart from each other and may not overlap. For example, a separation interval between the display panel 100 and the PCB 330 may be variously changed.

Therefore, the PCB 330 may be disposed at one side of the display panel 100, and thus, because a process of bending (or folding) the PCB 330 toward the rear surface of the display panel 100 is not needed, the number of processes may decrease, thereby implementing the display apparatus 1 having a thin thickness.

For example, in a case where the PCB 330 is disposed at a certain angle $\theta$ with respect to a virtual extension line (a first virtual extension line) of the first periphery portion of the display panel 100, the first periphery portion of the display panel 100 and the first periphery portion of the PCB 330 may be spaced apart from each other not to contact each other.

An angle $\theta$ between the display panel 100 and the PCB 330 may be variously adjusted. When an angle $\theta$ between the first virtual extension line and a virtual extension line (a second virtual extension line) of the first periphery portion of the PCB 330 is 0 degrees, the second sound SW2 generated based on a vibration of the PCB 330 may travel in the forward direction of the display panel 100, and when the angle $\theta$ between the first virtual extension line and the second virtual extension line is greater than 90 degrees, the second sound SW2 generated based on the vibration of the PCB 330 may travel in a rearward direction of the display panel 100. Accordingly, the PCB 330 according to an embodiment of the present disclosure may be disposed so that the angle $\theta$ between the first virtual extension line and the second virtual extension line is greater than 0 degrees and is not greater than 90 degrees.

Therefore, because the PCB 330 according to an embodiment of the present disclosure is disposed toward the forward-upward direction of the display panel 100, the display apparatus 1 may output the second sound SW2, generated based on a vibration of the PCB 330, toward the forward-upward direction of the display panel 100 and the output second sound SW2 may be reflected by an upper structure (for example, a ceiling) in a space with the display apparatus 1 disposed therein and may travel toward a user, and thus, the user may watch an image in the surround sound environment, thereby enhancing an immersion experience of the user.

The driving control circuit part 350 may be mounted on the PCB 330. For example, the driving control circuit part 350 may be mounted at a front surface or the rear surface of the PCB 330. For example, the driving control circuit part 350 may be mounted on the same surface as a surface on which the terminal 331 is disposed, or may be mounted at a surface which differs from a surface with the terminal 331 disposed thereon.

For example, the driving control circuit part 350 may include a timing control circuit and a voltage generating circuit, but embodiments of the present disclosure are not limited thereto.

The timing control circuit may receive the timing synchronization signal and video data supplied from the display host system. For example, the timing synchronization signal may include a vertical synchronization signal, a horizontal synchronization signal, a data enable signal, and a main clock signal, etc.

The timing control circuit may generate a gate control signal for controlling a driving timing of a gate driving circuit and a data control signal for controlling a driving timing of each of the plurality of data driving integrated circuits based on the timing synchronization signal.

The display host system may include a main board, various circuits mounted at the main board, various storage mediums, a peripheral device, a keyboard, and a power device, etc. The various circuits mounted at the main board may include a central control circuit for processing various information, an image processing circuit for processing data according to control by the central control circuit, and a sound processing circuit for processing a sound according to control by the central control circuit.

The display host system may process various information, generate the timing synchronization signal and the video data to provide the timing synchronization signal and the video data to the driving control circuit part 350 through the PCB 330, and may generate a driving signal including a sound signal or a haptic feedback signal to provide the driving signal to the PCB 330. For example, the sound signal may be synchronized with the video data, or may not be synchronized with the video data. The voltage generating circuit may generate various driving voltages needed for driving of the display apparatus 1.

The first member 400 according to an embodiment of the present disclosure may accommodate the display panel 100 and the panel driving circuit part 300. For example, the first member 400 may include a first structure 410 and a second structure 430. For example, the first member 400 may be referred to as a front cover, but embodiments of the present disclosure are not limited thereto.

The first structure 410 may be a rear structure which is disposed at the rear surface of the display panel 100 and a rear surface of the panel driving circuit part 300. For example, the first structure 410 may be a bottom structure, but embodiments of the present disclosure are not limited thereto. For example, the first structure 410 may support the display panel 100 and the panel driving circuit part 300. The first structure 410 may be spaced apart from the vibration apparatus 600 by a predetermined distance not to physically contact the vibration apparatus 600 when the vibration apparatus 600 is vibrating.

The second structure 430 may be a side structure which is disposed at a side surface of the display apparatus 1. For example, the second structure 430 may be provided at a periphery of the first structure 410 and may cover one or more side surfaces of the display panel 100.

The first structure 410 according to an embodiment of the present disclosure may include a plurality of grooves 411a and 413a which accommodate (or receive) the vibration apparatus 600. The grooves 411a and 413a may be disposed at a first surface (or a top surface or an inner surface) of the first structure 410 so as to be opposite to the vibration apparatus 600. Accordingly, the vibration apparatus 600 may decrease an interval between the first structure 410 and the display panel 100 with an interval by which the vibration apparatus 600 is accommodated into the grooves 411a and 413a, and thus, a thickness of the display apparatus 1 may decrease.

The first structure 410 according to an embodiment of the present disclosure may include a 1-$1^{st}$ structure 411 disposed to correspond to the display panel 100 and a 1-$2^{nd}$ structure 413 which extends from the 1-$1^{st}$ structure 411 and is disposed to correspond to the panel driving circuit part 300. For example, the PCB 330 may be disposed at a region corresponding to the 1-$2^{nd}$ structure 413.

The 1-$2^{nd}$ structure 413 may be disposed at a certain angle with respect to the 1-$1^{st}$ structure 411 toward the forward-upward direction of the display panel 100 from an end of a side (or a first portion) of the 1-$2^{nd}$ structure 413. For example, the first structure 410 may include a bent portion 450 disposed between the 1-$1^{st}$ structure 411 and the 1-$2^{nd}$ structure 413 toward an inner portion of the display apparatus 1. For example, the first structure 410 according to an embodiment of the present disclosure may cover a lower portion of the display panel 100 and may bending-extend to cover the panel driving circuit part 300. The first structure 410 may accommodate the display panel 100 and the panel driving circuit part 300 along with the second structure 430. For example, the bent degree of the bent portion 450, for example, an angle between the 1-$1^{st}$ structure 411 and the 1-$2^{nd}$ structure 413 may correspond to an angle $\theta$ between the display panel 100 and the PCB 330.

The second member 500 may be disposed to cover a front periphery portion of the display apparatus 1. For example, the second member 500 may conceal the panel driving circuit part 300, extend to cover an upper portion of the first member 400 and one periphery of the front surface of the display panel 100, and protect the panel driving circuit part 300 and the display panel 100. For example, the second member 500 may be connected or coupled to the second structure 430 of the first member 400 by a fastening member such as a hook, and thus, may cover a region, other than the display area, of the display panel 100. For example, the second member 500 may be a portion at which the second structure 430 bending-extend to the front surface of the display apparatus 1. For example, the second member 500 may be referred to as a rear cover, a rear surface cover, a rear surface member, or a rear member, but embodiments of the present disclosure are not limited thereto.

In the second member 500 according to an embodiment of the present disclosure, one or more sound discharge holes may be provided at a region overlapping the second vibration device 630 disposed at the PCB 330 of the panel driving circuit part 300. For example, the one or more sound discharge holes may be arranged at a certain interval at a region overlapping the second vibration device 630. The one or more sound discharge holes may transmit the second sound SW2 generated by a vibration of the second vibration device 630.

The first vibration device 610 may be provided as at least one or more at the rear surface of the display panel 100. For example, the first vibration device 610 may vibrate the display panel 100 by vibrating based on a sound signal (or a voice signal) transferred thereto to generate the first sound SW1. For example, the first vibration device 610 may vibrate based on a sound signal (or a voice signal) transferred through the flexible circuit film 310.

According to an embodiment of the present disclosure, the first vibration device 610 may be disposed at the rear surface of the display panel 100 by using a first adhesive member 710, and a method of arranging the first vibration device 610 is not limited to embodiments of the present disclosure. For example, the first vibration device 610 may be provided as one or more at the rear surface of the display panel 100, and a plurality of first vibration devices 610 may be disposed at at least one or more of the display area and the non-display area of the display panel 100. According to an embodiment of the present disclosure, the at least one or more first vibration devices 610 may generate the first sound SW1 having a frequency of the same pitched sound band in each region of the display panel 100, or may generate the first sound SW1 having frequencies of different pitched sound bands at each region of the display panel 100.

For example, the first sound SW1 having a frequency of the first pitched sound band may be output in a forward direction from a center portion of the display panel 100, and the first sound SW1 having a frequency of the second pitched sound band which is higher than the first pitched sound band may be output in a forward direction from a periphery portion of the display panel 100.

The second vibration device 630 may be provided as at least one or more at the rear surface of the PCB 330. For example, the second vibration device 630 may vibrate based on a sound signal (or a voice signal) transferred thereto to vibration the PCB 330, thereby generating the second sound SW2. For example, the second vibration device 630 may vibrate based on a sound signal (or a voice signal) transferred through the PCB 330.

According to an embodiment of the present disclosure, the second vibration device 630 may be disposed at the rear surface of the PCB 330 by using a second adhesive member 730, and a method of arranging the second vibration device 630 is not limited to embodiments of the present disclosure. For example, the second vibration device 630 may be provided as at least one or more at the rear surface of the PCB 330, and the at least one or more second vibration devices 630 may generate the second sound SW2 having a frequency of the same pitched sound band in each region of the PCB 330, or may generate the second sound SW2 having frequencies of different pitched sound bands at each region of the PCB 330.

Each of the first and second vibration devices 610 and 630 according to an embodiment of the present disclosure may be implemented a film type and may include a piezoelectric device including a piezoelectric material layer having a piezoelectric effect (or an inverse piezoelectric characteristic).

The piezoelectric material layer may include a piezoelectric material which generates a vibration based on an electric field. Here, the piezoelectric material may have a characteristic where pressure or twisting is applied to a crystalline structure by an external force, a potential difference occurs due to dielectric polarization caused by a relative position change of a positive (+) ion and a negative (−) ion, and a vibration is generated by an electric field based on a voltage applied thereto.

The piezoelectric material layer according to an embodiment of the present disclosure may include a piezoelectric material including a polymer material, a piezoelectric material including a thin film material, a piezoelectric material including a composite material, or a piezoelectric material including single crystalline ceramic or polycrystalline ceramic. The piezoelectric material including the polymer material according to an embodiment of the present disclosure may include polyvinylidene fluoride (PVDF), poly (vinylidene fluoridetrifluoroethylene) (P(VDF-TrFe)), or poly(vinylidene fluoridetetrafluoroethylene) (P(VDFTeFE)). The piezoelectric material including the thin film material according to an embodiment of the present disclosure may include ZnO, CdS, or A1N. The piezoelectric material including the composite material may include lead zirconate titanate (PZT)-PVDF, PZT-silicon rubber, PZT-epoxy, PZT-foam polymer, or PZT-foam urethane. The piezoelectric material including the single crystalline ceramic according to an embodiment of the present disclosure may include aluminum phosphate (for example, berlinite, $\alpha$-AlPO$_4$), silico dioxide (for example, $\alpha$-SiO$_2$), lithium niobate (LiNbO$_3$), terbium molybdate (Tb$_2$(MoO$_4$)$_3$), lithium tetraborate (Li$_2$B$_4$O$_7$), or ZnO. The piezoelectric material including the polycrystalline ceramic according to an embodiment of the present disclosure may include a PZT-based material, a PT-based material, PZT-complex perovskites, or barium titanate (BaTiO$_3$).

The first adhesive member 710 may be disposed between the rear surface of the display panel 100 and a surface (or a first surface, or a front surface), facing the display panel 100, of the first vibration device 610 and may attach the display panel 100 at the first vibration device 610.

The second adhesive member 730 may be disposed between the rear surface of the PCB 330 and a surface (or a first surface, or a front surface), facing the PCB 330, of the second vibration device 630 and may attach the PCB 330 at the second vibration device 630.

The third adhesive member 750 may be disposed between a rear surface of the second member 500 and the front surface of the PCB 330 and may attach the second member 500 at the PCB 330. For example, the third adhesive member 750 may attach a second periphery portion (or a portion opposite to a first periphery portion) of the PCB 330 at the second member 500.

The first to third adhesive members 710, 730, and 750 according to an embodiment of the present disclosure may include an adhesive or a double-sided tape including an adhesive layer which is good in adhesive force or attaching force. For example, the adhesive layer may include epoxy, acryl, silicone, or urethane, but embodiments of the present disclosure are not limited thereto. The adhesive layer may further include an additive such as a tackifier, a wax component, or an antioxidant.

Figure 4:
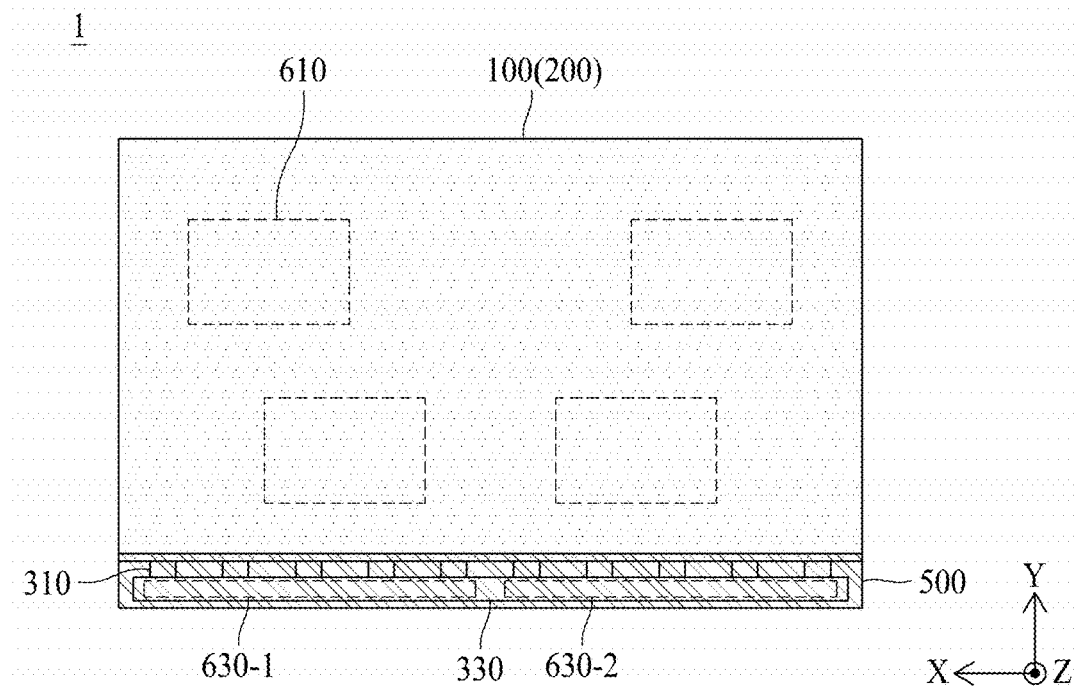
FIGS. 4 and 5 are plan views of another embodiment illustrating a front surface of the display apparatus illustrated in FIG. 1.
Figure 5:
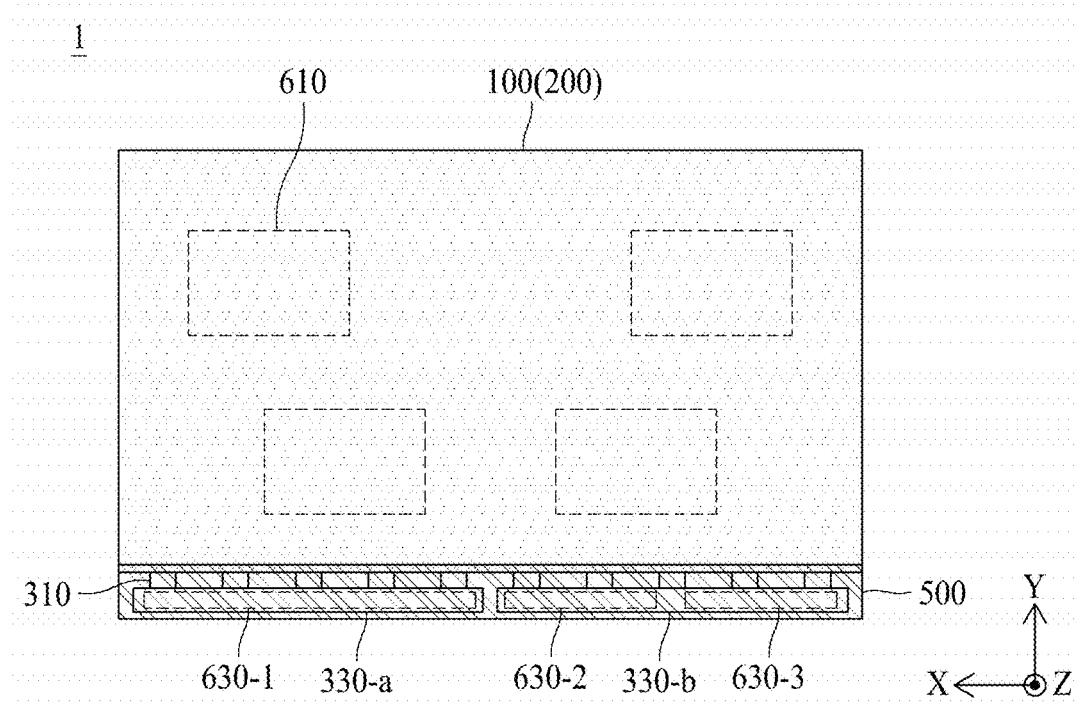

FIGS. 4 and 5 are plan views of another embodiment illustrating a front surface of the display apparatus illustrated in FIG. 1.

A display apparatus 1 illustrated in FIGS. 4 and 5 may be implemented by changing the number of PCBs and second vibration devices described above in the display apparatus 1 illustrated in FIG. 1. Hereinafter, therefore, the display apparatus 1 will be described with reference to FIGS. 4 and 5, and descriptions which are the same as or similar to the descriptions of the display apparatus 1 of FIG. 1 are omitted or will be briefly given below.

With reference to FIG. 4, a display apparatus 1 may include one PCB 330 and a plurality of second vibration devices 630-1 and 630-2. In FIG. 4, it is illustrated that two second vibration devices 630-1 and 630-2 are disposed at the one PCB 330, but the number of second vibration devices may be three or more. For example, the plurality of second vibration devices 630-1 and 630-2 may generate a second sound SW2 having a frequency of the same pitched sound band at each region of the PCB 330, or may generate the second sound SW2 having frequencies of different pitched sound bands in each region of the PCB 330.

With reference to FIG. 5, a display apparatus 1 may include a plurality of PCBs 330-a and 330-b and a plurality of second vibration devices 630-1 to 630-3. In FIG. 5, it is illustrated that one second vibration device 630-1 is disposed at one PCB 330-a among two PCBs 330-a and 330-b and two second vibration devices 630-2 and 630-3 are disposed at the other PCB 330-b. Therefore, a different number of second vibration device may be disposed at each of a plurality of PCBs, and embodiments of the present disclosure are not limited thereto. For example, one second vibration device may be disposed at each of a plurality of PCBs, and a same number of second vibration devices may be disposed at plurality on each of a plurality of PCBs.

For example, the plurality of second vibration devices 630-1 to 630-3 may generate a second sound SW2 having a frequency of the same pitched sound band in each region of the plurality of PCBs 330-a and 330-b, or may generate the second sound SW2 having frequencies of different pitched sound bands in each region of the PCB 330.

With reference to FIG. 5, when the display apparatus 1 includes the plurality of PCBs 330-a and 330-b, each of the plurality of PCBs 330-a and 330-b may be independently disposed at one side of the display panel 100, and an angle between each of the plurality of PCBs 330-a and 330-b and the display panel 100 may be the same or differ.

Figure 6:
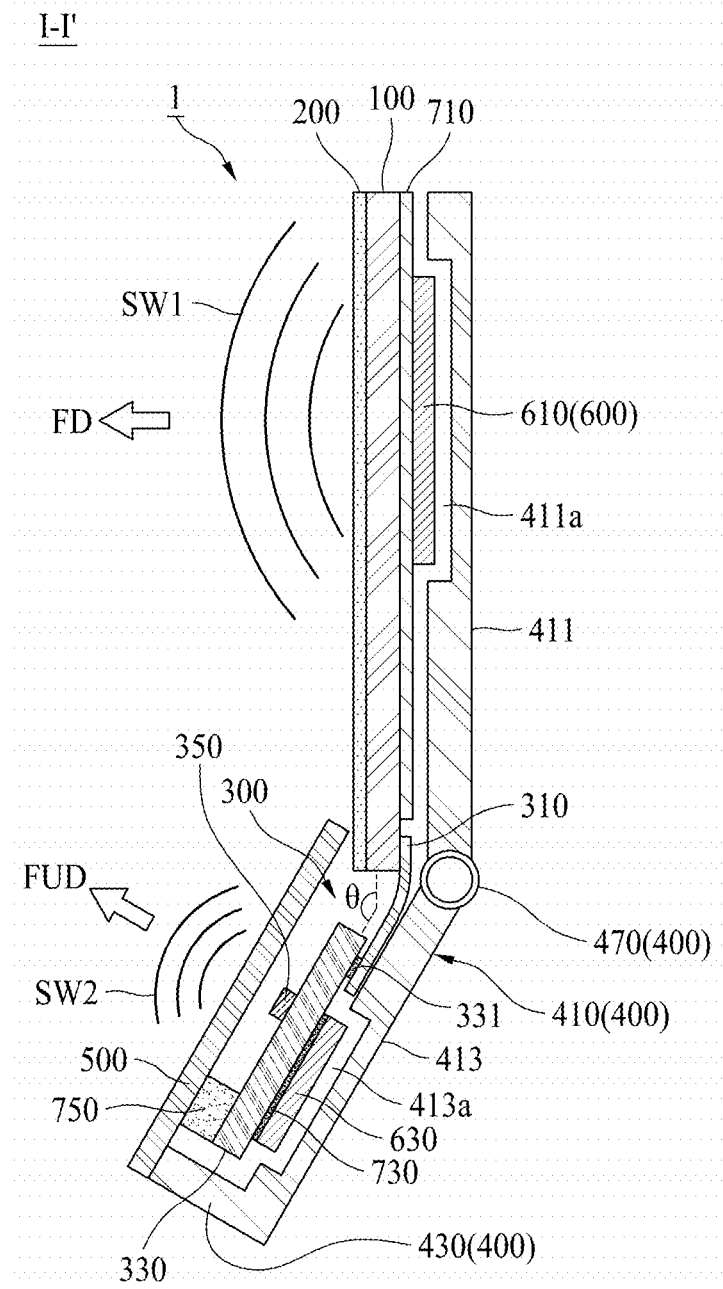
FIG. 6 is another cross-sectional view taken along line I-I' illustrated in FIG. 2.

FIG. 6 is another cross-sectional view taken along line I-I' illustrated in FIG. 2.

The display apparatus 1 of FIG. 3 may include the bent portion 450 which is formed between the 1-1$^{st}$ structure 411 and the 1-2$^{nd}$ structure 413, and a display apparatus 1 of FIG. 6 may include a hinge portion 470 which is formed between a 1-1$^{st}$ structure 411 and a 1-2$^{nd}$ structure 413. Hereinafter, the display apparatus 1 will be described below with reference to FIG. 6, and descriptions which are the same as or similar to the descriptions of the display apparatus 1 of FIG. 3 are omitted or will be briefly given below.

With reference to FIG. 6, the hinge portion 470 may be disposed between the 1-1$^{st}$ structure 411 and the 1-2$^{nd}$ structure 413. For example, each of one side of the 1-1$^{sth}$ structure 411 and one side of the 1-2$^{nd}$ structure 413 may be connected to the hinge portion 470. For example, the one side of the 1-1$^{st}$ structure 411 may be fixed to the hinge portion 470, and the one side of the 1-2$^{nd}$ structure 413 may be disposed to rotate with respect to the hinge portion 470. Alternatively, the one side of the 1-2$^{nd}$ structure 413 may be fixed to the hinge portion 470, and the one side of the 1-1$^{sth}$ structure 411 may be disposed to rotate with respect to the hinge portion 470. Accordingly, an angle between the 1-1$^{st}$ structure 411 and the 1-2$^{nd}$ structure 413 may be variously changed based on the degree of rotation of the 1-1$^{sth}$ structure 411 or the 1-2$^{nd}$ structure 413.

Therefore, the 1-1$^{st}$ structure 411 or the 1-2$^{nd}$ structure 413 may be disposed to rotate with respect to the hinge portion 470, and thus, the angle between the 1-1$^{st}$ structure 411 and the 1-2$^{nd}$ structure 413 may be variously changed. Also, based on a rotation of the 1-2$^{nd}$ structure 413, the PCB 330 disposed to correspond to the 1-2$^{nd}$ structure 413 may rotate with respect to the hinge portion 470, and thus, an output direction of the second sound SW2 generated based on a vibration of the PCB 330 may be variously changed. Accordingly, the output direction of the second sound SW2 generated based on the vibration of the PCB 330 may be changed, and thus, the 1-2$^{nd}$ structure 413 may be adjusted based on a position of a user, an arrangement state of the display apparatus 1, and a space environment where the display apparatus 1 is disposed, thereby providing an optimal surround environment.

For example, the 1-2$^{nd}$ structure 413 may be disposed to rotate within only a certain range with respect to the hinge portion 470. For example, a second member 500 may rotate based on a rotation of the 1-2$^{nd}$ structure 413 and an excessive rotation of the second member 500 may affect the display panel 100, and thus, a rotation angle of the 1-2$^{nd}$ structure 413 may be limited so that the 1-2$^{nd}$ structure 413 rotates within a range where the second member 500 does not affect a display panel 100.

Moreover, to prevent a contact between the second member 500 and the display panel 100 from occurring when the second member 500 rotates based on a rotation of the 1-2$^{nd}$ structure 413, a region where the display panel 100 overlaps the second member 500 may be spaced apart from each other. For example, the region where the display panel 100 overlaps the second member 500 may be spaced apart from the display panel 100 with a height configured to prevent a contact between the second member 500 and the display panel 100 from occurring when the 1-2$^{nd}$ structure 413 is rotating. Also, when the third member 200 is disposed at a front surface of the display panel 100, a region where the third member 200 overlaps the second member 500 may be spaced apart from the third member 200 with an interval configured to prevent a contact between the second member 500 and the third member 200 from occurring when the 1-2$^{nd}$ structure 413 is rotating.

A separation distance of the region where the display panel 100 overlaps the second member 500 and a separation distance of the region where the third member 200 overlaps the second member 500 may be variously adjusted.

FIGS. 7 to 10 are plan views illustrating an embodiment where a plate is disposed on a PCB of the display apparatus illustrated in FIG. 1. Except for that a plate 800 is disposed at the PCB 330 described above with reference to FIGS. 1 to 5, the other elements may be the same, and thus, their repetitive descriptions are omitted or will be briefly given below.

In FIGS. 7 to 10, it is illustrated that the plate 800 is disposed at a rear surface of the PCB 330, the plate 800 may be disposed at a front surface of the PCB 330 or may be disposed at a front surface and a rear surface of the PCB 330.

Figure 7:
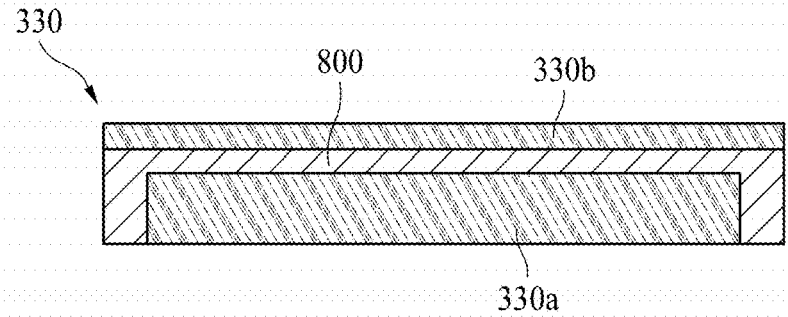
FIGS. 7 to 10 are plan views illustrating an embodiment where a plate is disposed at a printed circuit board of the display apparatus illustrated in FIG. 1.
Figure 8:
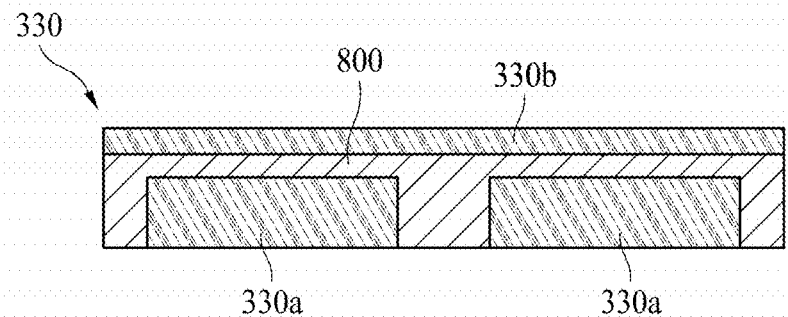
Figure 9:
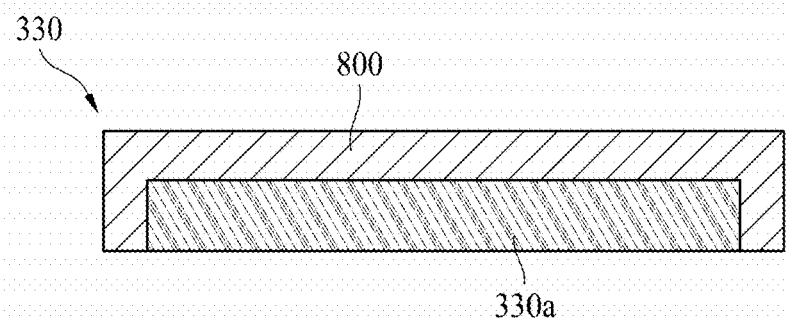
Figure 10:
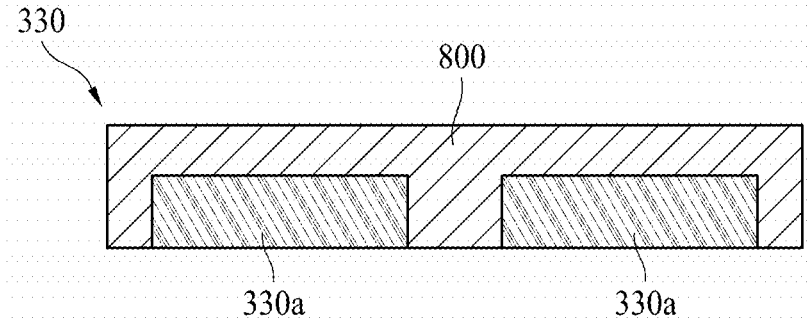

FIGS. 7 and 8 are plan views of a case where one or more terminals 331 connected to the flexible circuit film 310 and a region (a mount region) 330b with a driving control circuit part 350 mounted thereon are provided at a rear surface of the PCB 330. FIGS. 9 and 10 are plan views of a case where a mount region is provided at a front surface of the PCB 330.

With reference to FIGS. 7 and 8, the plate 800 may be disposed at a region other than a vibration device disposition region 330a with a second vibration device 630 disposed therein and a mount region 330b.

In FIGS. 7 and 8, an example where one mount region 330b is provided along a first periphery portion of the PCB 330 is illustrated, and the number and positions of mount regions 330b are not limited to an embodiment of the present disclosure.

With reference to FIGS. 9 and 10, a plate 800 may be disposed at a region other than a vibration device disposition region 330a.

An example where one vibration device disposition region 330a is provided along a second periphery portion of the PCB 330 is illustrated in FIGS. 7 and 9 and an example where two vibration device disposition regions 330a is provided along the second periphery portion of the PCB 330 is illustrated in FIGS. 8 and 10, the number and positions of vibration device disposition regions 330a are not limited to an embodiment of the present disclosure. For example, one or a plurality of second vibration devices 630 may be disposed at each vibration device disposition region 330a.

Therefore, because the plate 800 is disposed at a rear surface of the PCB 330, the stiffness of the PCB 330 may be reinforced, and thus, the PCB 330 may be prevented from being bent by the arrangement of the second vibration device and a vibration of the second vibration device 630 may be efficiently transferred to the PCB 330.

Moreover, heat generated based on a vibration of the second vibration device 630 may be diffused through the plate 800, and thus, heat may be dissipated and the performance of the second vibration device 630 may be prevented from being reduced when the heat generated based on the vibration of the second vibration device 630 concentrates on a region near the second vibration device 630.

Figure 11:
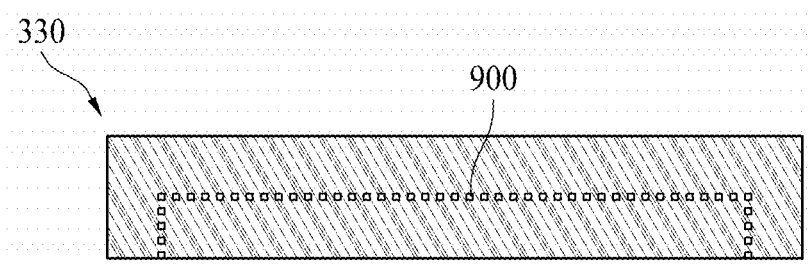
FIGS. 11 and 12 are plan views illustrating an embodiment where a first pattern is disposed at a printed circuit board of the display apparatus illustrated in FIG. 1.
Figure 12:
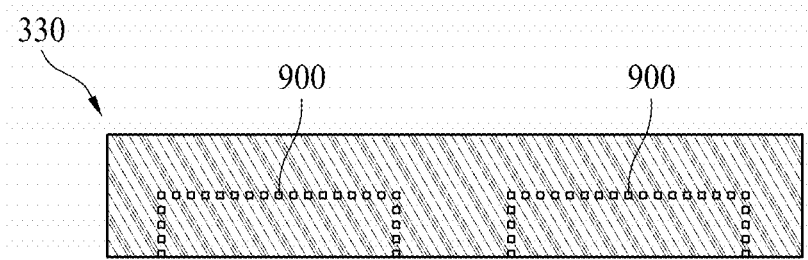

FIGS. 11 and 12 are plan views illustrating an embodiment where a first pattern is disposed at a PCB of the display apparatus illustrated in FIG. 1. Except for that a first pattern 900 is disposed at the rear surface of the PCB 330 described above with reference to FIGS. 1 to 5, the other elements may be the same, and thus, their repetitive descriptions are omitted or will be briefly given below.

FIG. 11 is a plan view of an example where the first pattern 900 is disposed in a case where one vibration device disposition region is provided. FIG. 12 is a plan view of an example where the first pattern 900 is disposed in a case where a plurality of vibration device disposition regions are provided.

A resonance frequency f of a material may be determined based on $\sqrt{(k/m)}$ (where k is stiffness, and m is mass). Therefore, when a pattern for varying stiffness k and mass m of a PCB 330 is disposed at the PCB 330, a resonance frequency of the PCB 330 may vary, and a characteristic of a sound generated based on a vibration of the PCB 330 may be controlled by controlling the resonance frequency of the PCB 330.

An example where the first pattern 900 is disposed at a rear surface of the PCB 330 is illustrated in FIGS. 11 and 12, but the first pattern 900 may be disposed at a front surface of the PCB 330 or may be disposed at all of the front surface and the rear surface of the PCB 330. The first pattern 900 according to an embodiment of the present disclosure may be disposed at least one or more among periphery portions of the PCB 330. The first pattern 900 may be referred to as a sound control pattern, a sound adjustment pattern, a sound characteristic control pattern, and a sound characteristic adjustment pattern, but embodiments of the present disclosure are not limited thereto.

As illustrated in FIGS. 11 and 12, the first pattern 900 according to an embodiment of the present disclosure may be disposed as a type which surrounds the second vibration device 630, but an arrangement position of the first pattern 900 is not limited thereto. For example, the first pattern 900 may be freely disposed at one or more regions of the PCB 330 within a range which does not affect elements (for example, terminals, a driving circuit control part, lines, etc.) disposed at the PCB 330.

The first pattern 900 according to an embodiment of the present disclosure may be implemented to decrease the stiffness and the mass of the PCB 330. For example, the first pattern 900 may include at least one or more grooves or holes. The first pattern 900 according to an embodiment of the present disclosure may be implemented to increase the stiffness and mass of the PCB 330. For example, the first pattern 900 may include at least one or more protrusions. The first pattern 900 according to an embodiment of the present disclosure may include two or more different forms of at least one or more grooves, holes, and protrusions.

An example where the plate 800 is disposed at the PCB 330 is illustrated in FIGS. 7 to 10, and an example where the first pattern 900 is disposed at the PCB 330 is illustrated in FIGS. 11 and 12. In FIGS. 7 to 12, the plate 800 and the first pattern 900 may be separately disposed, but embodiments of the present disclosure are not limited thereto and the plate 800 and the first pattern 900 may be disposed at the PCB 330 together.

Figure 13:
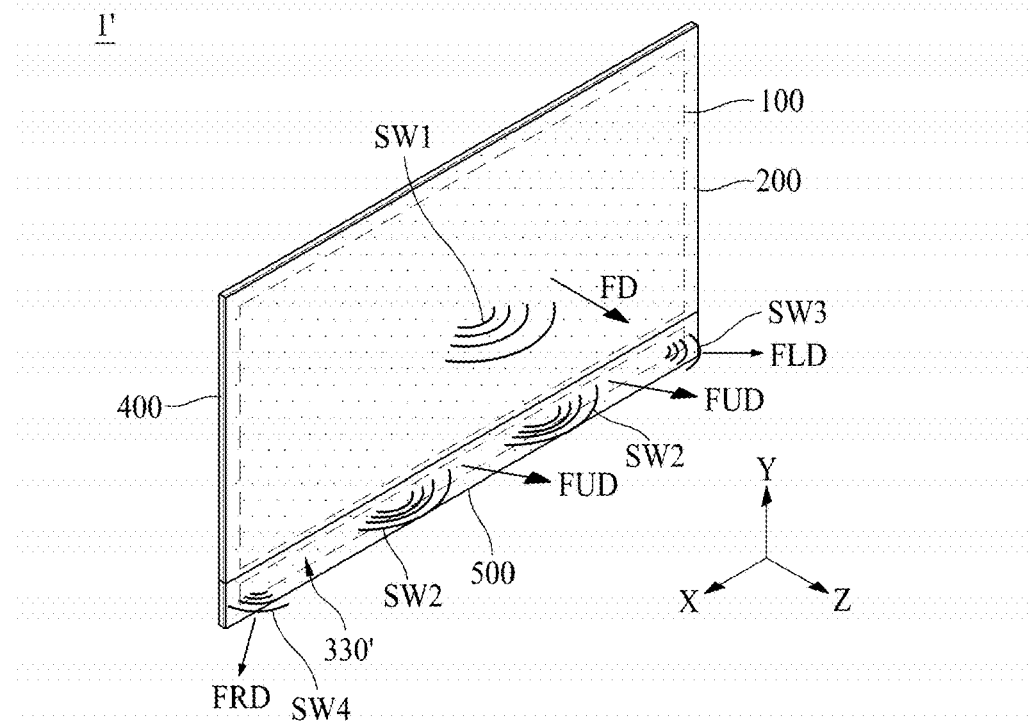
FIG. 13 illustrates a display apparatus according to another embodiment of the present disclosure.

FIG. 13 illustrates a display apparatus according to another embodiment of the present disclosure.

With reference to FIG. 13, the display apparatus 1' according to another embodiment of the present disclosure may output a sound SW in one or more directions thereof based on vibrations of elements included in the display apparatus 1'. The display apparatus 1' according to another embodiment of the present disclosure may output a first sound SW1 in a forward direction FD of a display panel 100, output a second sound SW2 in a forward-upward direction FUD of the display panel 100, output a third sound SW3 in a left-forward direction FLD of the display panel 100, and output a fourth sound SW4 in a right-forward direction FRD of the display panel 100. Alternatively, the display apparatus 1' according to another embodiment of the present disclosure may output the first sound SW1 in the forward direction FD of the display panel 100, output the second sound SW2 in the forward-upward direction FUD of the display panel 100, output the third sound SW3 in the right-forward direction FRD of the display panel 100, and output the fourth sound SW4 in the left-forward direction FLD of the display panel 100. For example, the output directions of the third sound SW3 and the fourth sound SW4 are changeable.

For example, the display apparatus 1' may output the first sound SW1 which is generated by using the display panel 100 as a vibration plate for generating a sound and may output the second to fourth sounds SW2 to SW4 which are generated by using a PCB' as a vibration plate for generating a sound. According to an embodiment of the present disclosure, the display apparatus 1' may simultaneously or sequentially output the first to fourth sounds SW1 to SW4. According to an embodiment of the present disclosure, the display apparatus 1' may simultaneously output some sounds and may sequentially output some sounds (or the other sounds).

Therefore, the display apparatus 1' according to another embodiment of the present disclosure may output a sound SW in one or more directions thereof, and thus, a user (a viewer or a listener) may watch an image in the surround sound environment, thereby enhancing an immersion experience of the user.

The display apparatus 1' according to another embodiment of the present disclosure illustrated in FIG. 13 may be implemented by modifying the PCB among the elements of the display apparatus 1 according to an embodiment of the present disclosure. In the following description, therefore, repetitive descriptions of elements other than a PCB are omitted or will be briefly given.

Figure 14:
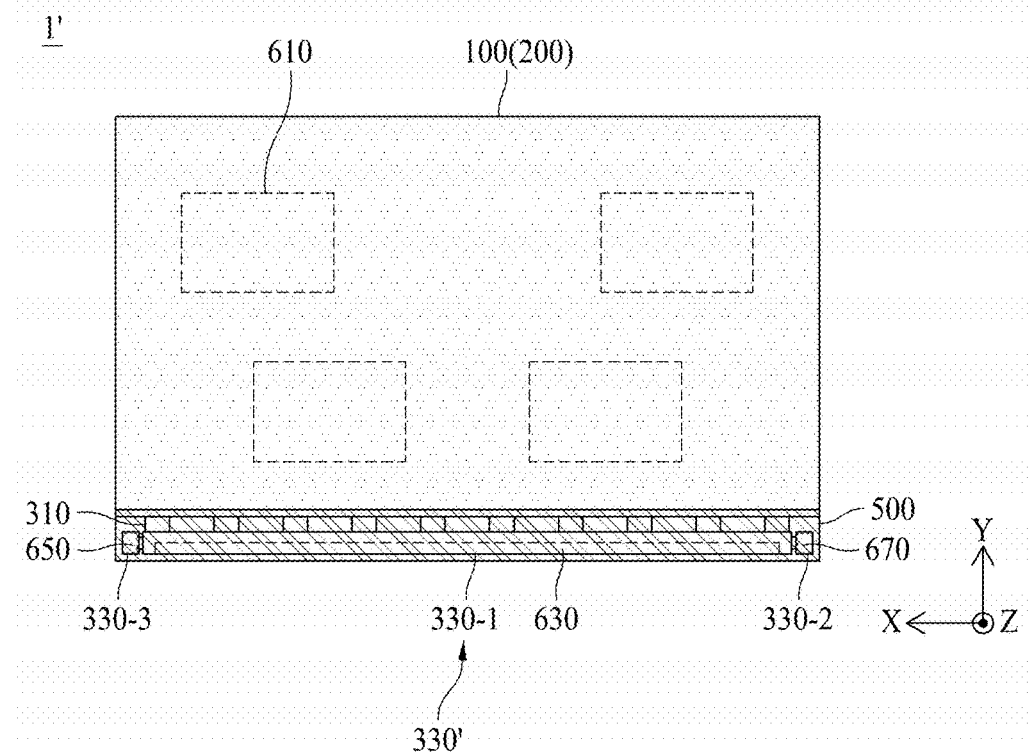
FIG. 14 is a plan view illustrating a front surface of the display apparatus illustrated in FIG. 13.
Figure 15:
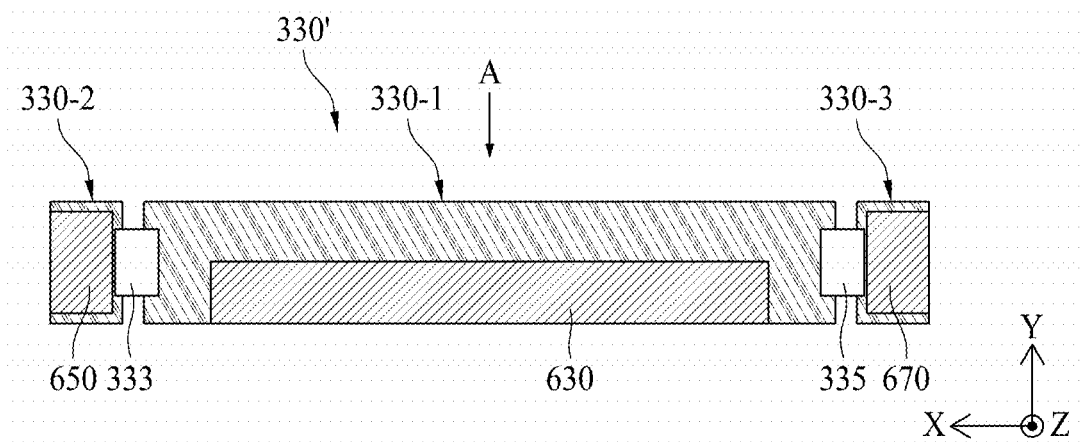
FIG. 15 is a plan view illustrating a rear surface of a printed circuit board illustrated in FIG. 14.
Figure 16:
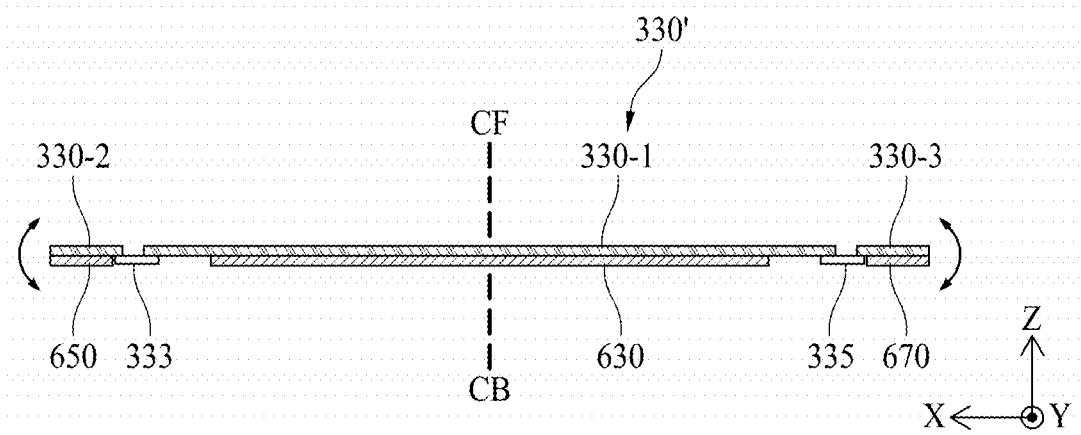
FIG. 16 illustrates a first state of a printed circuit board as seen in a direction A of FIG. 15.
Figure 17:
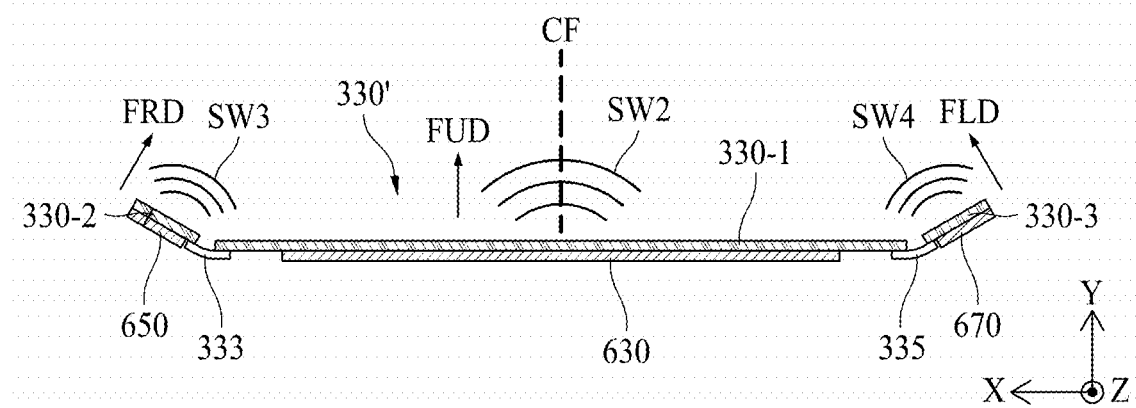
FIG. 17 illustrates a second state of a printed circuit board as seen in the direction A of FIG. 15.
Figure 18:
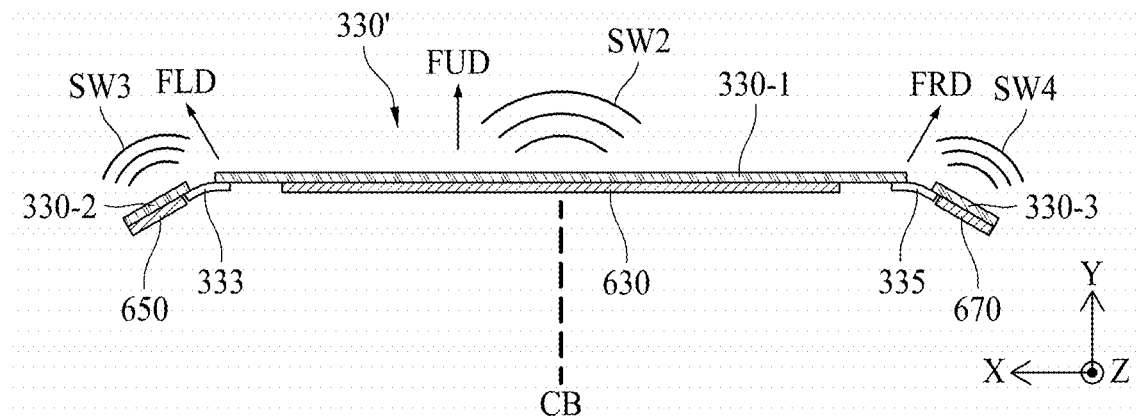
FIG. 18 illustrates a third state of a printed circuit board as seen in the direction A of FIG. 15.

FIG. 14 is a plan view illustrating a front surface of the display apparatus illustrated in FIG. 13. FIG. 15 is a plan view illustrating a rear surface of a PCB illustrated in FIG. 14. FIG. 16 illustrates a first state of a PCB as seen in a direction A of FIG. 15. FIG. 17 illustrates a second state of a PCB as seen in the direction A of FIG. 15. FIG. 18 illustrates a third state of a PCB as seen in the direction A of FIG. 15.

The first state of the PCB illustrated in FIG. 16 may be a state of a PCB when first and second connection members 333 and 335 are not bent. The second state of the PCB illustrated in FIG. 17 may be a state of a PCB when the first and second connection members 333 and 335 are bent toward a front surface of a first PCB 330-1. The third state of the PCB illustrated in FIG. 18 may be a state of a PCB when the first and second connection members 333 and 335 are bent toward a rear surface of the first PCB 330-1.

With reference to FIGS. 14 to 18, a PCB 330' included in the display apparatus 1' according to another embodiment of the present disclosure may include a first PCB 330-1 and second and third PCBs 330-2 and 330-3 respectively connected to both sides (a third periphery portion and a fourth periphery portion) of the first PCB 330-1 in a first direction X.

Moreover, a second vibration device 630 may be disposed at a rear surface of the first PCB 330-1. A third vibration device 650 and a fourth vibration device 670 may be respectively disposed at a rear surface of the second PCB 330-2 and a rear surface of the third PCB 330-3.

In an embodiment of the present disclosure, it is illustrated that one second vibration device 630 is disposed at the rear surface of the first PCB 330-1 and one third vibration device 650 and one fourth vibration device 670 are respectively disposed at the rear surface of the second PCB 330-2 and the rear surface of the third PCB 330-3, but the present embodiment is not limited thereto. According to another embodiment of the present disclosure, one or more second vibration devices 630 may be disposed on the rear surface of the first PCB 330-1, and one or more third and fourth vibration devices 650 and 670 may be respectively disposed at the rear surface of the second and third PCBs 330-2 and 330-3.

The first PCB 330-1 may be referred to as a master PCB, a source PCB, or a main PCB. The first PCB 330-1 may be the same as the PCB 330 included in the display apparatus 1 according to an embodiment of the present disclosure, and thus, its repetitive description is omitted.

In an embodiment of the present disclosure, an example where the first PCB 330-1 is provided as one will be described, and an example where the first PCB 330-1 is provided in plurality will be described below.

The second PCB 330-2 and the third PCB 330-3 may be referred to as a slave PCB and a sub-PCB and may act as a tweeter.

The second PCB 330-2 may be connected to a third periphery portion (a left periphery portion with respect to a forward direction of the display panel 100) of the first PCB 330-1 by using a first connection member 333. The third PCB 330-3 may be connected to a fourth periphery portion (a right periphery portion with respect to the forward direction of the display panel 100) of the first PCB 330-1 by using a second connection member 335.

The first connection member 333 and the second connection member 335 may be bent toward a front surface side and a rear surface side (or a Z-axis direction) of the first PCB 330-1. Based on a direction in which the first and second connection members 333 and 335 are bent, the second PCB 330-2 and the third PCB 330-3 may be disposed toward the left-forward direction FLD or the right-forward direction FRD of the display panel 100.

According to an embodiment of the present disclosure, as illustrated in FIG. 17, the first and second connection members 333 and 335 may be bent toward a front surface side of the first PCB 330-1 or a front center CF of the display panel 100. Therefore, the second PCB 330-2 may be disposed toward the right-forward direction FRD of the display panel 100 and the third PCB 330-3 may be disposed toward the left-forward direction FLD of the display panel 100, and thus, the second PCB 330-2 and the third PCB 330-3 may be disposed toward the front center CF of the display panel 100.

Therefore, a third sound SW3 generated based on a vibration of the second PCB 330-2 may travel toward the right-forward direction FRD of the display panel 100 and a fourth sound SW4 generated based on a vibration of the third PCB 330-3 may travel toward the left-forward direction FLD of the display panel 100, and thus, the third sound SW3 and the fourth sound SW4 may travel toward the front center CF of the display panel 100.

According to an embodiment of the present disclosure, as illustrated in FIG. 18, the first and second connection members 333 and 335 may be bent toward a rear surface side of the first PCB 330-1 or a rear center CB of the display panel 100. Therefore, the second PCB 330-2 may be disposed toward the left-forward direction FLD of the display panel 100 and the third PCB 330-3 may be disposed toward the right-forward direction FRD of the display panel 100, and thus, the second PCB 330-2 and the third PCB 330-3 may be disposed toward an outer portion with respect to the forward direction of the display panel 100.

Therefore, the third sound SW3 generated based on a vibration of the second PCB 330-2 may travel toward the left-forward direction FLD of the display panel 100 and the fourth sound SW4 generated based on a vibration of the third PCB 330-3 may travel toward the right-forward direction FRD of the display panel 100, and thus, the third sound SW3 and the fourth sound SW4 may travel toward an outer portion of the forward direction of the display panel 100.

Therefore, according to an embodiment of the present disclosure, the second PCB 330-2 may be disposed toward the left-forward direction FLD or the right-forward direction FRD of the display panel 100 at a third periphery portion or a left periphery portion of the first PCB 330-1 with respect to the forward direction of the display panel 100 and may vibrate based on a vibration of the third vibration device 650 to generate the third sound SW3. The third PCB 330-3 may be disposed toward the left-forward direction FLD or the right-forward direction FRD of the display panel 100 at a fourth periphery portion or a right periphery portion of the first PCB 330-1 with respect to the forward direction of the display panel 100 and may vibrate based on a vibration of the fourth vibration device 670 to generate the fourth sound SW4.

The first connection member 333 and the second connection member 335 may each include a line (or a wire) for supplying a sound signal (or a voice signal) to the third and fourth vibration modules 650 and 670 respectively disposed at the second and third PCBs 330-2 and 330-3, and for example, may each be a flexible printed circuit board (FPCB), but embodiments of the present disclosure are not limited thereto.

The bending degree of the first connection member 333 and the bending degree of the second connection member 335 may be variously changed based on a sound environment which is to be provided through the display apparatus 1', but embodiments of the present disclosure are not limited thereto.

Figure 19:
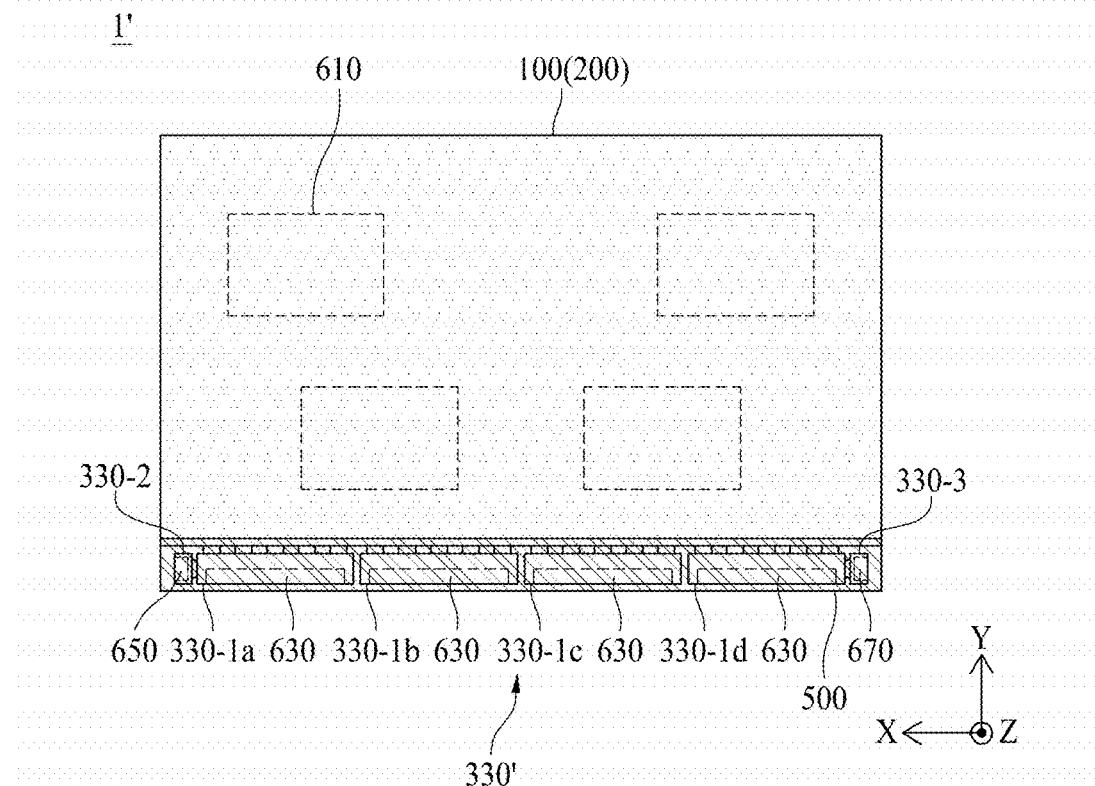
FIG. 19 is another plan view illustrating the front surface of the display apparatus illustrated in FIG. 13.
Figure 20:
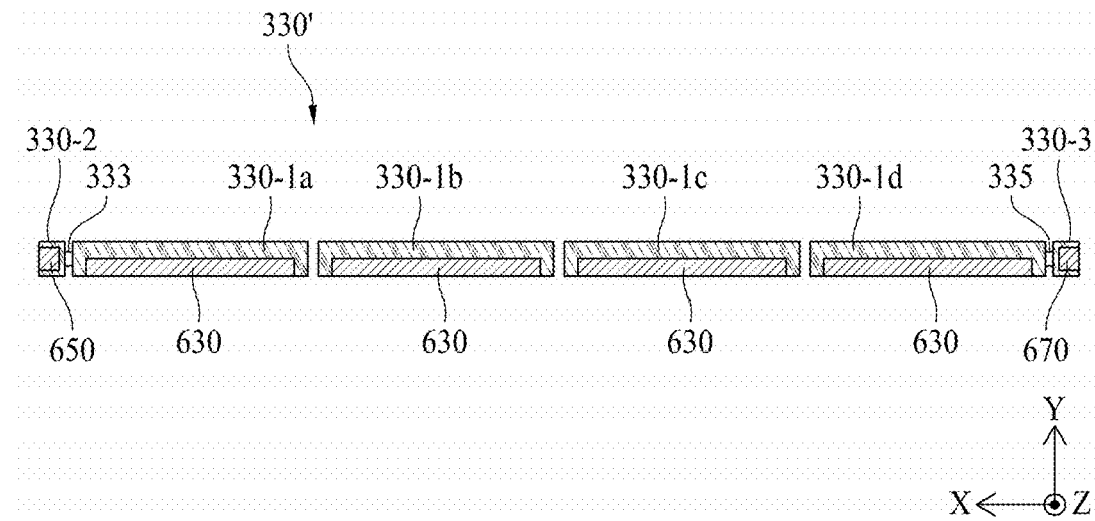
FIG. 20 is a plan view of an embodiment illustrating a rear surface of a printed circuit board illustrated in FIG. 19.

FIG. 19 is another plan view illustrating the front surface of the display apparatus illustrated in FIG. 13, and FIG. 20 is a plan view of an embodiment illustrating a rear surface of a PCB illustrated in FIG. 19.

A display apparatus 1' illustrated in FIG. 19 may be implemented by modifying the PCB among the elements of the display apparatus 1' illustrated in FIG. 13. In the following description, therefore, repetitive descriptions of elements other than a PCB are omitted or will be briefly given.

The display apparatus 1' illustrated in FIG. 19 may include a plurality of first PCBs.

With reference to FIGS. 19 and 20, a PCB 330' included in the display apparatus 1' illustrated in FIG. 19 may include a plurality of first PCBs 330-1a to 330-1d, a second PCB 330-2 connected to the first PCB 330-1a disposed at one end (a left end) with respect to a forward direction of a display panel 100 among the plurality of first PCBs 330-1a to 330-1d, and a third PCB 330-3 connected to the first PCB 330-1d disposed at the other end (a right end) with respect to the forward direction of the display panel 100 among the plurality of first PCBs 330-1a to 330-1d.

In an embodiment of the present disclosure, the PCB 300' is illustrated as including four first PCBs 3301a to 330-1d, and the number of first PCBs may be two, three, or five or more.

According to an embodiment of the present disclosure, the plurality of first PCBs 330-1a to 330-1d may be arranged at a certain interval in parallel in a first direction X. The second PCB 330-2 may be connected to the first PCB 330-1a disposed at the left end with respect to the forward direction of the display panel 100 among the plurality of first PCBs 330-1a to 330-1d. The third PCB 330-3 may be connected to the first PCB 330-1d disposed at the right end with respect to the forward direction of the display panel 100 among the plurality of first PCBs 330-la to 330-1d.

The second PCB 330-2 may be connected to a third periphery portion (a left periphery portion with respect to the forward direction of the display panel 100) of the first PCB 330-1a at a left end thereof by using a first connection member 333. The third PCB 330-3 may be connected to a fourth periphery portion (a right periphery portion with respect to the forward direction of the display panel 100) of the first PCB 330-1d at a right end thereof by using a second connection member 335.

As the first connection member 333 and the second connection member 335 are bent in the forward direction or a rearward direction of the display panel 100, the second PCB 330-2 and the third PCB 330-3 may be disposed toward the left-forward direction FLD or the right-forward direction FRD of the display panel 100 and may be vibrated by the third and fourth vibration modules 650 and 670 to generate third and fourth sounds SW3 and SW4. This has been described above with reference to FIGS. 15 to 18, and thus, their repetitive descriptions are omitted.

With reference to FIGS. 19 and 20, when the display apparatus 1' includes the plurality of first PCBs 330-1a to 330-1d, according to an embodiment of the present disclosure, an angle of each of the plurality of first PCBs 330-1a to 330-1d and the display panel 100 may be the same or differ.

Figure 21:
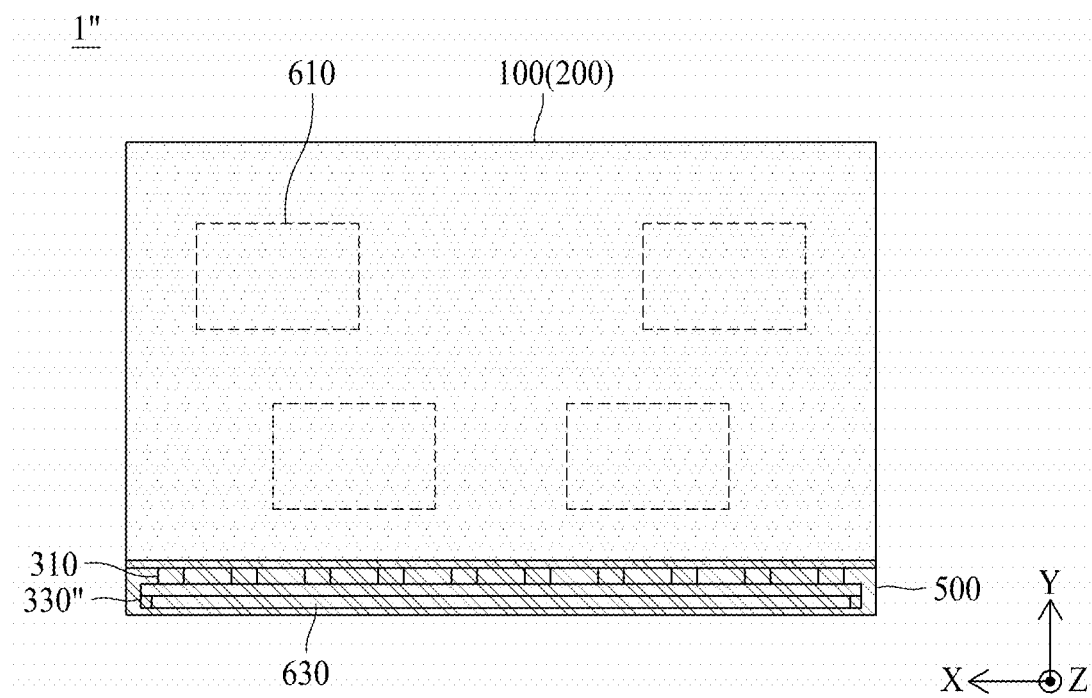
FIG. 21 is a plan view illustrating a front surface of a display apparatus according to another embodiment of the present disclosure.
Figure 22:
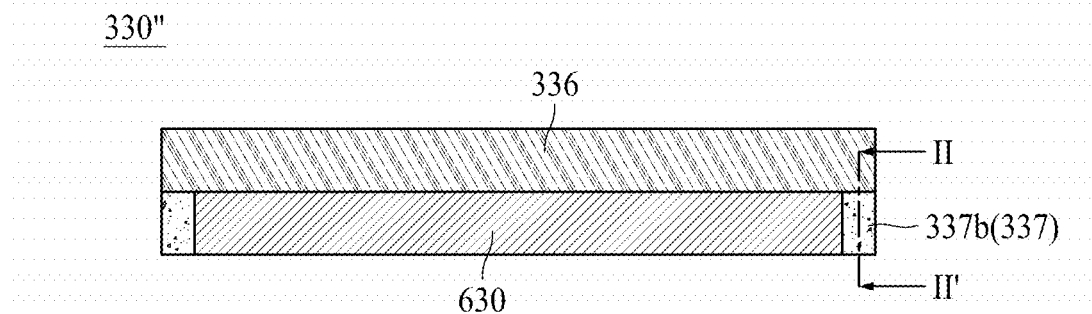
FIG. 22 illustrates a front surface of a PCB of FIG. 21.
Figure 23:
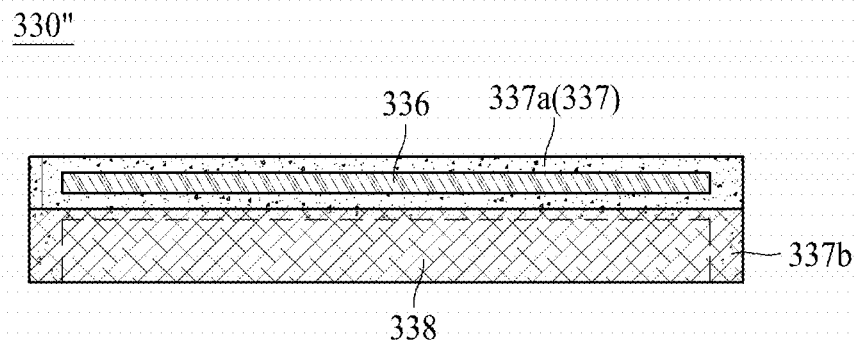
FIG. 23 illustrates a rear surface of the PCB of FIG. 21.
Figure 24:
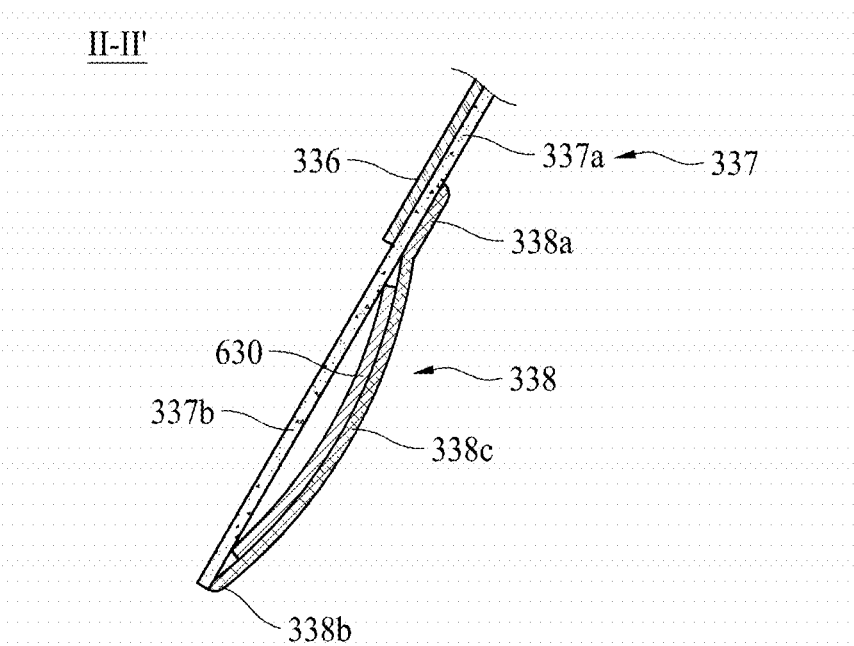
FIG. 24 is a cross-sectional view taken along line II-II' of FIG. 22.
Figure 25:
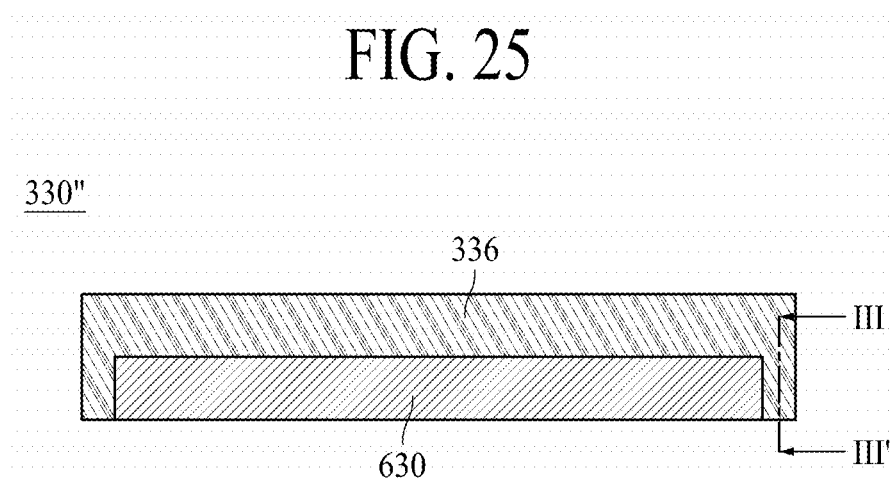
FIG. 25 is a diagram of another embodiment illustrating a front surface of a printed circuit board of FIG. 21.

FIG. 21 is a plan view illustrating a front surface of a display apparatus according to another embodiment of the present disclosure. FIG. 22 illustrates a front surface of a PCB of FIG. 21. FIG. 23 illustrates a rear surface of the PCB of FIG. 21. FIG. 24 is a cross-sectional view taken along line II-IF of FIG. 22. FIG. 25 is a diagram of another embodiment illustrating the front surface of the PCB of FIG. 21.

Figure 26:
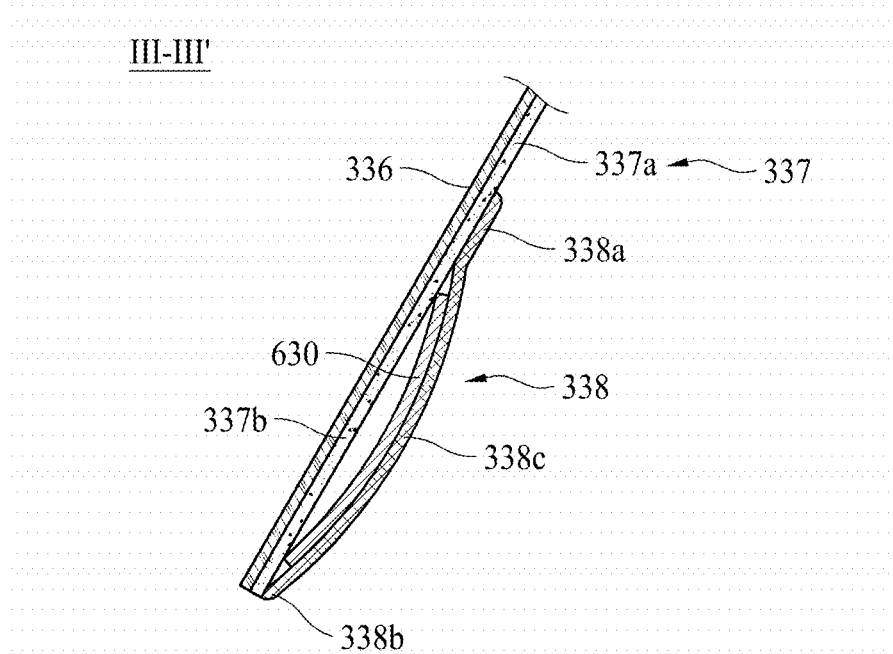
FIG. 26 is a cross-sectional view taken along line of FIG. 25.
Figure 27:
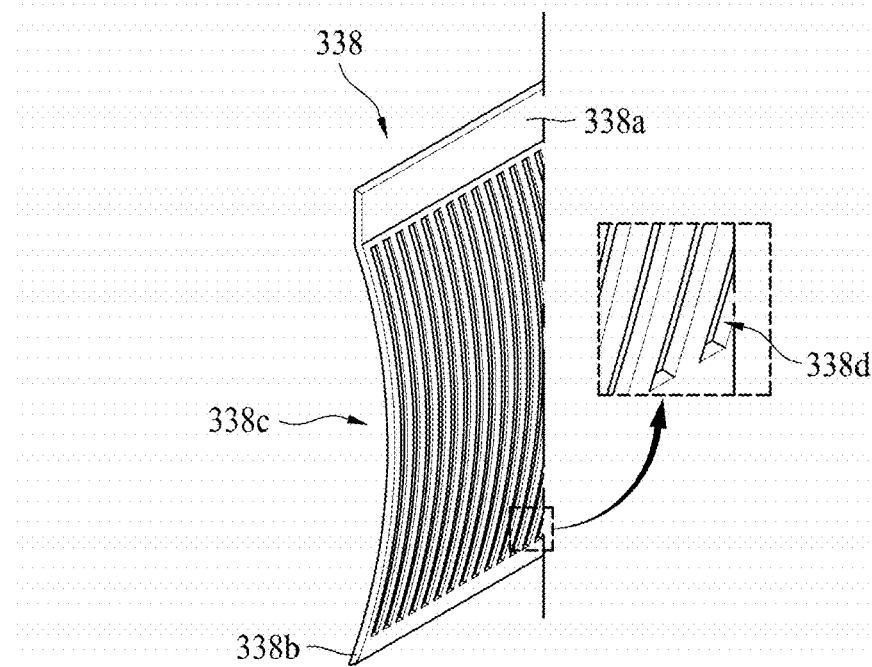
FIG. 27 illustrates a portion of a supporting member of the display apparatus of FIG. 21.

FIG. 26 is a cross-sectional view taken along line of FIG. 25. FIG. 27 illustrates a portion of a supporting member of the display apparatus of FIG. 21.

A display apparatus 1" illustrated in FIG. 21 may be implemented by modifying the PCB among the elements of the display apparatus 1 illustrated in FIG. 1. In the following description, therefore, repetitive descriptions of elements other than a PCB are omitted or will be briefly given.

With reference to FIGS. 21 to 25, a PCB 330" included in the display apparatus 1" illustrated in FIG. 21 may include a base member 336, a fourth member 337 disposed at a rear surface of the base member 336, and a fifth member 338 which is disposed at a rear surface of the fourth member 337 to support a second vibration device 630.

The base member 336 of the PCB 330" according to an embodiment of the present disclosure may be implemented with the PCB 330 of FIG. 1 or the first PCB 330-1 among the PCBs 330' of FIG. 13, and its repetitive description is omitted or will be briefly given below. For example, the PCB 330" according to an embodiment of the present disclosure may be applied to the PCB 330 of FIG. 1 and may be applied to the first PCB 330-1 among the PCBs 330' of FIG. 13.

Therefore, a structure of the PCB 330" according to an embodiment of the present disclosure may be implemented by placing a fourth member 337 and a fifth member 338 at the rear surface of the PCB 330 of FIG. 1. The structure of the PCB 330" may be implemented by placing the fourth member 337 and the fifth member 338 at the rear surface of the first PCB 330-1 among the PCBs 330' of FIG. 13, and the structure of the PCB 330" described below may be identically applied to the PCB 330 of FIG. 1 and the first PCB 330-1 of FIG. 13.

For example, the base member 336 may have a tetragonal planar shape as illustrated in FIG. 22 or may have a ⊏-shaped planar shape as illustrated in FIG. 25, and a shape of the base member 336 is not limited to an embodiment of the present disclosure.

The fourth member 337 according to an embodiment of the present disclosure may be a structure for placing the fifth member 338. The fourth member 337 may transfer a vibration of the second vibration device 630 to the base member 336. For example, the fourth member 337 may include a first region 337a and a second region 337b. The first region 337a may be disposed at a rear surface of the base member 336 to transfer a vibration of the second vibration device 630 to the base member 336, and the fourth member 337 may be a structure which is supported and fixed the rear surface of the base member 336. The second region 337b may be a structure which extends from the first region 337a and where the fifth member 338 is disposed. For example, the fourth member 337 may be referred to as a guide member, but embodiments of the present disclosure are not limited thereto.

The fifth member 338 according to an embodiment of the present disclosure may be disposed at a rear surface of the fourth member 337. As an embodiment of the present disclosure, a first portion 338a of the fifth member 338 may be formed to be flat and may be attached at the rear surface of the fourth member 337 by a manner as an attachment (or a bonding) or the like. As an embodiment of the present disclosure, a second portion 338b of the fifth member 338 may be attached or detached at or from the rear surface of the fourth member 337 by a manner as a fastening or the like. The fifth member 338 according to an embodiment of the present disclosure may include a third portion 338c which is provided between the first portion 338a and the second portion 338b and supports the second vibration device 630. As an embodiment of the present disclosure, the third portion 338c of the fifth member 338 may be disposed at the second region 337b of the fourth member 337. For example, the fifth member 338 may be referred to as a supporting member, but embodiments of the present disclosure are not limited thereto. For example, the third portion 338c may be referred to as a supporting part, but embodiments of the present disclosure are not limited thereto.

In the fifth member 338 according to an embodiment of the present disclosure, a surface (or a front surface, or an inner surface) of the third portion 338c facing the fourth member 337, may have a concave shape having a certain curvature. Therefore, in the fifth member 338, a surface (or a rear surface, or an outer surface), which is opposite to the front surface, of the third portion 338c may have a convex shape having a certain curvature. Accordingly, the second vibration device 630 disposed at the third portion 338c may correspond to a shape of the third portion 338c and may be disposed in a shape which is concave toward the fourth member 337.

Therefore, according to an embodiment of the present disclosure, a vibration of the second vibration device 630 may be transferred to the base member 336 along the fourth member 337 and the fifth member 338, and thus, the base member 336 may vibrate to generate a sound. Also, the third portion 338c of the fifth member 338 may vibrate based on a vibration of the second vibration device 630 to generate a sound, and the sound generated by the third portion 338c may concentrate toward a center of a curvature based on a shape of the third portion 338c, whereby the sound may be amplified.

A sound generated based on a vibration of the fifth member 338 and a sound generated based on a vibration of the base member 336 may have frequencies of different pitched sound bands. Accordingly, the PCB 330" according to an embodiment of the present disclosure may output a sound, having a broad frequency spectrum, in the forward direction of the display panel 100.

The fifth member 338 according to an embodiment of the present disclosure may include a second pattern 338d which is formed at the third portion 338c. The second pattern 338d according to an embodiment of the present disclosure may be a groove, but embodiments of the present disclosure are not limited thereto. As illustrated in FIG. 27, the second pattern 338d may be formed at a rear surface (or an outer surface) of the third portion 338c, but embodiments of the present disclosure are not limited thereto. For example, the second pattern 338d may be formed at a front surface (or an inner surface) of the third portion 338c, or may be formed at all of a front surface and a rear surface of the third portion 338c. For example, when the second pattern 338d is formed at the third portion 338c, a resonance frequency of the third portion 338c may be controlled by varying a mass and stiffness of the third portion 338c, and thus, a frequency characteristic of a sound generated based on a vibration of the third portion 338c may be set. For example, the second pattern 338d may be a frequency setting pattern and a frequency adjustment pattern, but embodiments of the present disclosure are not limited thereto.

Figure 28:
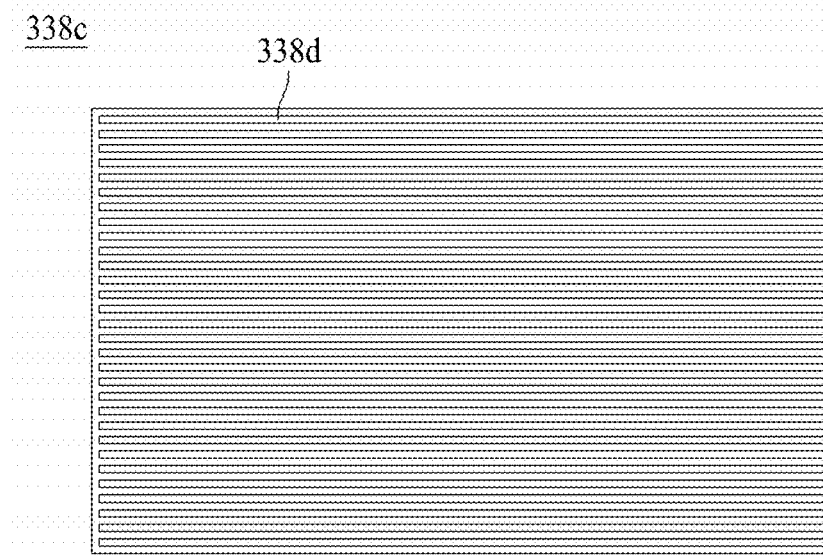
FIGS. 28 to 30 are plan views illustrating third portions according to an embodiment of the present disclosure.
Figure 29:
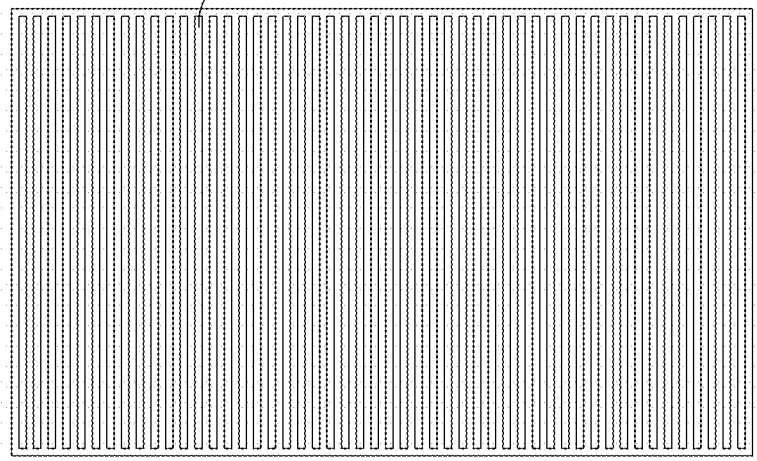
Figure 30:
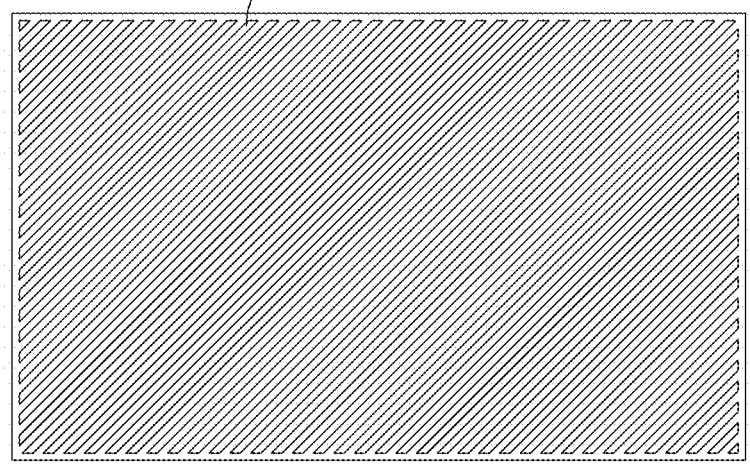

FIGS. 28 to 30 are plan views illustrating third portions according to an embodiment of the present disclosure. FIGS. 31 to 34 are side views illustrating third portions according to another embodiment of the present disclosure.

Figure 31:
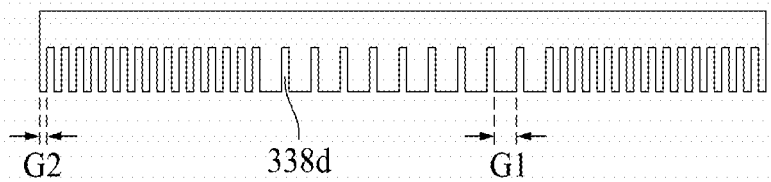
FIGS. 31 to 34 are side views illustrating third portions according to another embodiment of the present disclosure.

For example, as illustrated in FIGS. 28 and 29, the second pattern 338d may be provided in plurality to have a line shape or a stripe shape. As illustrated in FIG. 30, the second pattern 338d may be provided in plurality to have a diagonal shape. As an embodiment of the present disclosure, an interval of the second pattern 338d may be the same or differ. For example, intervals of all of the second patterns 338d may be the same or differ. As an embodiment of the present disclosure, the second pattern 338d may include a plurality of groups based on an arrangement position at the third portion 338c. Intervals of second patterns 338d included in one among the plurality of groups may be the same, and intervals of second patterns 338d included in another group among the plurality of groups may differ. One or a plurality of second patterns 338d may be included in one group. As an embodiment of the present disclosure, as illustrated in FIG. 31, a first interval G1 of a second pattern 338d disposed in one region (for example, a center portion) of the third portion 338c may be greater than a second interval G2 of a second pattern 338d disposed in the other region (for example, a periphery (or a periphery portion) of the center portion) of the third portion 338c, but embodiments of the present disclosure are not limited thereto.

Figure 32:
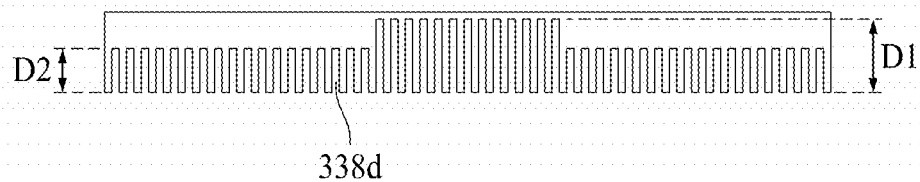

As an embodiment of the present disclosure, all of the second patterns 338d may be formed to have the same depth, or may be formed to have different depths. For example, the second pattern 338d may include a plurality of groups based on an arrangement position at the third portion 338c. Depths of second patterns 338d included in one among the plurality of groups may be the same, and depths of second patterns 338d included in another group among the plurality of groups may differ. One or a plurality of second patterns 338d may be included in one group. As an embodiment of the present disclosure, as illustrated in FIG. 32, a first depth D1 of the second pattern 338d disposed in the one region (for example, the center portion) of the third portion 338c may be deeper than a second depth D2 of the second pattern 338d disposed in the other region (for example, the periphery (or the periphery portion) of the center portion) of the third portion 338c, but embodiments of the present disclosure are not limited thereto.

Figure 33:
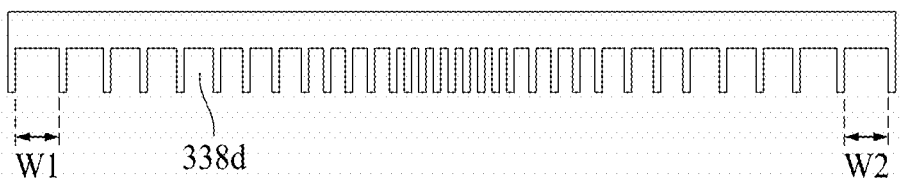
Figure 34:
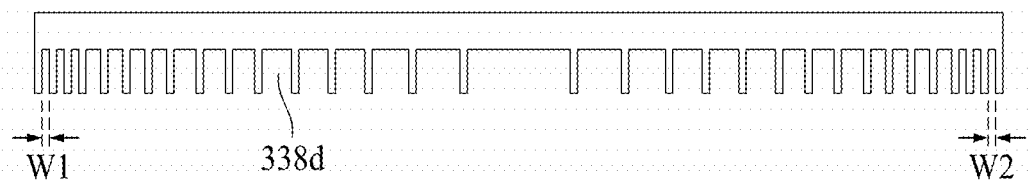

As an embodiment of the present disclosure, all of the second patterns 338d may be formed to have the same width, or may be formed to have different widths. For example, the second pattern 338d may include a plurality of groups based on an arrangement position at the third portion 338c. Widths of second patterns 338d included in one of the plurality of groups may be the same, and widths of second patterns 338d included in another group among the plurality of groups may differ. One or a plurality of second patterns 338d may be included in one group. As an embodiment of the present disclosure, the second pattern 338d may be formed so that a width thereof is narrowed or widened in a direction from one periphery of the third portion 338c to the other periphery of the third portion 338c. As an embodiment of the present disclosure, as illustrated in FIG. 33, the second pattern 338d may be formed so that first and second widths W1 and W2 thereof are narrowed in a direction from the one periphery of the third portion 338c to the other periphery of the third portion 338c, or as illustrated in FIG. 34, the second pattern 338d may be formed so that the first and second widths W1 and W2 thereof are widened in a direction from the one periphery of the third portion 338c to the other periphery of the third portion 338c.

Figure 35:
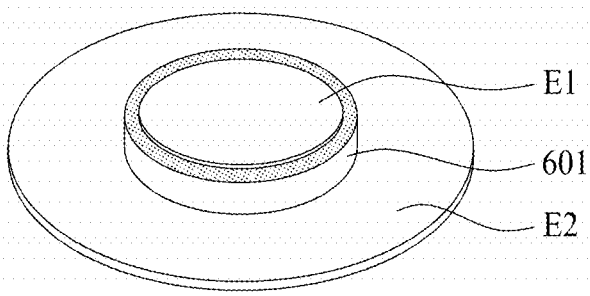
FIG. 35 illustrates a vibration apparatus according to an embodiment of the present disclosure.

FIG. 35 illustrates a vibration apparatus according to an embodiment of the present disclosure.

With reference to FIG. 35, the vibration apparatus 600 according to an embodiment of the present disclosure may include a piezoelectric vibration portion 601, a first electrode portion E1, and a second electrode portion E2.

The piezoelectric vibration portion 601 may include a piezoelectric material (or an electroactive material) having a piezoelectric effect. For example, the piezoelectric material may have a characteristic where pressure or twisting (or bending) is applied to a crystalline structure by an external force, a potential difference occurs due to dielectric polarization caused by a relative position change of a positive (+) ion and a negative (−) ion, and a vibration is generated by an electric field based on a voltage applied thereto. The piezoelectric vibration portion 601 may be referred to as a vibration layer, a piezoelectric layer, a piezoelectric material layer, an electroactive layer, a vibration portion, a piezoelectric material portion, an electroactive portion, a piezoelectric structure, an inorganic material layer, or an inorganic material portion, but embodiments of the present disclosure are not limited thereto.

The piezoelectric vibration portion 601 may be formed of a transparent, semitransparent, or opaque piezoelectric material (or an electroactive material), and may be transparent, semitransparent, or opaque. The piezoelectric vibration portion 601 may be formed of a ceramic-based material for generating a relatively high vibration, or may be formed of piezoelectric ceramic having a perovskite-based crystalline structure. The perovskite crystalline structure may have a piezoelectric effect and an inverse piezoelectric effect and may be a plate-shaped structure having orientation. The perovskite crystalline structure may be represented by a chemical formula "$ABO_3$". Here, A may include a divalent metal element, and B may include a tetravalent metal element. For example, in the chemical formula "$ABO_3$", A and B may be cations, and O may be anions. For example, the piezoelectric vibration portion 601 may include at least one or more of $PbTiO_3$, $PbZrO_3$, $PbZrTiO_3$, $BaTiO_3$, and $SrTiO_3$, but embodiments of the present disclosure are not limited thereto.

The piezoelectric vibration portion 601 according to an embodiment of the present disclosure may include a lead zirconate titanate (PZT)-based material including lead (Pb), zirconium (Zr), and titanium (Ti) or may include a lead zirconate nickel niobate (PZNN)-based material including lead (Pb), zirconium (Zr), nickel (Ni), and niobium (Nb), but embodiments of the present disclosure are not limited thereto. Also, the piezoelectric vibration portion 601 may include at least one or more of $CaTiO_3$, $BaTiO_3$, and $SrTiO_3$ without Pb, but embodiments of the present disclosure are not limited thereto.

The piezoelectric vibration portion 601 according to an embodiment of the present disclosure may be configured in a circular shape, an ellipse shape, or a polygonal shape, but embodiments of the present disclosure are not limited thereto.

The first electrode portion E1 may be disposed at a first surface (or a top surface, or an upper surface, or a front surface) of the piezoelectric vibration portion 601, and electrically connected to the first surface of the piezoelectric vibration portion 601. For example, the first electrode portion E1 may have a single-body electrode type (or a common electrode) which is disposed at a whole first surface of the piezoelectric vibration portion 601. For example, the first electrode portion may have the same shape as the piezoelectric vibration portion 601, but embodiments of the present disclosure are not limited thereto. The first electrode portion E1 according to an embodiment of the present disclosure may be formed of a transparent conductive material, a semitransparent conductive material, or an opaque conductive material. For example, examples of the transparent conductive material or the semitransparent conductive material may include indium tin oxide (ITO) or indium zinc oxide (IZO), but embodiments of the present disclosure are not limited thereto. Examples of the opaque conductive material may include aluminum (Al), copper (Cu), gold (Au), silver (Ag), molybdenum (Mo), and Mg or an alloy thereof, but embodiments of the present disclosure are not limited thereto.

The second electrode portion E2 may be disposed at a second surface (or a bottom surface, or a lower surface, or a rear surface), which is opposite to the first surface, of the piezoelectric vibration portion 601, and electrically connected to the second surface of the piezoelectric vibration portion 601. For example, the second electrode portion E2 may have a single-body electrode type (or a common electrode) which is disposed at a whole second surface of the piezoelectric vibration portion 601. For example, the second electrode portion E2 may have a larger size than that of the piezoelectric vibration portion 601, and may have the same shape as the piezoelectric vibration portion 601, but embodiments of the present disclosure are not limited thereto. The second electrode portion E2 according to an embodiment of the present disclosure may be formed of a transparent conductive material, a semitransparent conductive material, or an opaque conductive material. For example, the second electrode portion E2 may be formed of the same material as the first electrode portion E1, but embodiments of the present disclosure are not limited thereto. In another example, the second electrode portion E2 may be formed of a different material than the first electrode portion E1.

The piezoelectric vibration portion 601 may be polarized (or poling) by a certain voltage applied to the first electrode portion E1 and the second electrode portion E2 in a certain temperature atmosphere, or a temperature atmosphere that may be changed from a high temperature to a room temperature. Embodiments of the present disclosure are not limited to these examples. The piezoelectric vibration portion 601 may vibrate by alternately and/or repeatedly contract and expand based on a piezoelectric effect (or a piezoelectric characteristic) according to a sound signal (or a voice signal) applied to the first electrode portion E1 and the second electrode portion E2 from the outside.

The vibration apparatus 600 according to an embodiment of the present disclosure may further include a first protection member and a second protection member.

The first protection member may be disposed at the first electrode portion E1 and protect the first electrode portion E1. For example, the first protection member may be formed of a plastic material, a fiber material, or wood material, but embodiments of the present disclosure are not limited thereto.

The second protection member may be disposed at the second electrode portion E2 and protect the second electrode portion E2. For example, the second protection member may be formed of a plastic material, a fiber material, or wood material, but embodiments of the present disclosure are not limited thereto. For example, the first protection member may be formed of the same or different material as the second protection member. Any one of the first protection member and the second protection member may be attached to or coupled to the display panel via an adhesive member.

Figure 36:
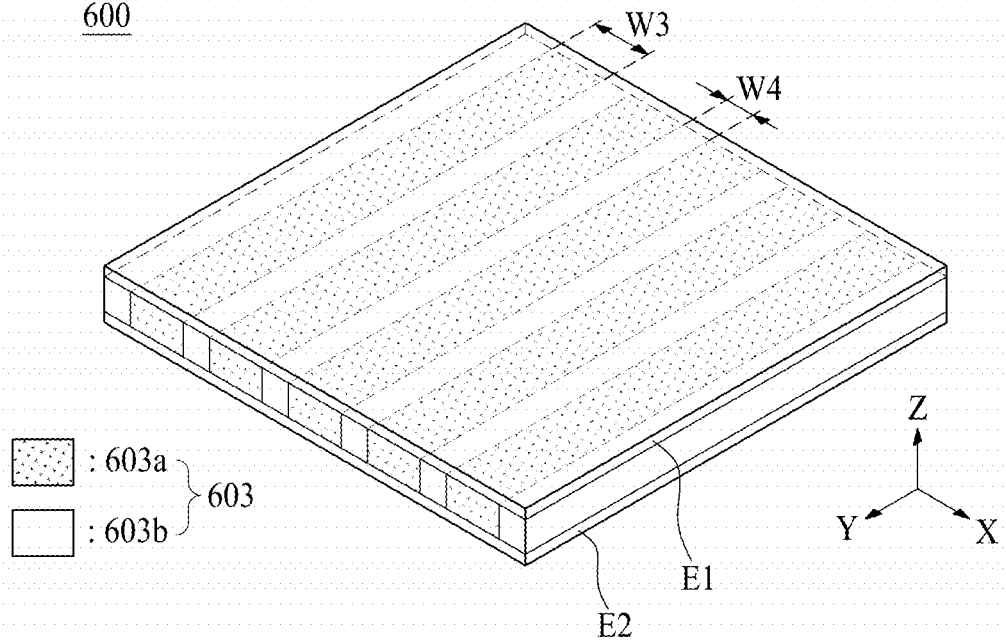
FIG. 36 illustrates a vibration apparatus according to another embodiment of the present disclosure.

FIG. 36 illustrates a vibration apparatus according to another embodiment of the present disclosure.

With reference to FIG. 36, the vibration apparatus 600 according to other embodiment of the present disclosure may be referred to as a flexible sound generator, a flexible actuator, a flexible speaker, a flexible piezoelectric speaker, a film actuator, a film piezoelectric composite actuator, a film speaker, a film piezoelectric speaker, or film piezoelectric composite speaker, but embodiments of the present disclosure are not limited thereto.

The vibration apparatus 600 according to an embodiment of the present disclosure may include a piezoelectric vibration portion 603, a first electrode portion E1, and a second electrode portion E2.

The piezoelectric vibration portion 603 may include a piezoelectric material, a composite piezoelectric material, or an electroactive material, and the piezoelectric material, the composite piezoelectric material and the electroactive material may have a piezoelectric effect. The piezoelectric vibration portion 603 may be referred to as a vibration layer, a piezoelectric layer, a piezoelectric material layer, an electroactive layer, a vibration portion, a piezoelectric material portion, an electroactive portion, a piezoelectric structure, a piezoelectric composite layer, a piezoelectric composite, or a piezoelectric ceramic composite, but embodiments of the present disclosure are not limited thereto. The piezoelectric vibration portion 603 may be formed of a transparent, semitransparent, or opaque piezoelectric material, and may be transparent, semitransparent, or opaque.

The piezoelectric vibration portion 603 according to an embodiment of the present disclosure may include a plurality of first portions 603a and a plurality of second portions 603b. For example, the plurality of first portions 603a and the plurality of second portions 603b may be alternately and repeatedly arranged in a first direction X (or a second direction Y). For example, the first direction X may be a widthwise direction or a first horizontal direction of the piezoelectric vibration portion 603. The second direction Y may be a lengthwise direction or a second horizontal direction of the piezoelectric vibration portion 603 crossing the first direction X. An embodiment of the present disclosure is not limited thereto, and the first direction X may be the lengthwise direction or the second horizontal direction of the piezoelectric vibration portion 603, and the second direction Y may be the widthwise direction or the first horizontal direction of the piezoelectric vibration portion 603.

Each of the plurality of first portions 603a may be configured as an inorganic material portion. The inorganic material portion may include the above-described piezoelectric material. For example, each of the plurality of first portions 603a may include a piezoelectric material which is be substantially the same as the piezoelectric vibration portion 603 described above with reference to FIG. 35, and thus, their repetitive descriptions may be omitted.

Each of the plurality of first portions 603a according to an embodiment of the present disclosure may be disposed between the plurality of second portions 603b. For example, the plurality of first portions 603a may have a third width W3 parallel to the first direction X (or the second direction Y) and a length parallel to the second direction Y (or the first direction X). Each of the plurality of second portions 603b may have a fourth width W4 parallel to the first direction X (or the second direction Y) and may have a length parallel to the second direction Y (or the first direction X). The third width W3 may be the same as or different from the fourth width W4. For example, the third width W3 may be greater than the fourth width W4. For example, the first portion 603a and the second portion 603b may include a line shape or a stripe shape which has the same size or different sizes. Therefore, the piezoelectric vibration portion 603 may include a 2-2 composite structure and thus may have a resonance frequency of 20 kHz or less, but embodiments are not limited thereto and a resonance frequency of the piezoelectric vibration portion 603 may vary based on one or more of a shape, a length, and a thickness.

In the piezoelectric vibration portion 603, each of the plurality of first portions 603a and the plurality of second portions 603b may be disposed (or arranged) at the same plane (or the same layer) in parallel. Each of the plurality of second portions 603b may be connected or attached to a second portion 603b adjacent thereto. For example, each of the plurality of second portions 603b may be configured to fill a gap between two adjacent first portions of the plurality of first portions 603a and may be connected or attached to a second portion 603b adjacent thereto. The piezoelectric vibration portion 603 may extend by a desired size or length based on the side coupling (or connection) of the first portion 603a and the second portion 603b.

In the piezoelectric vibration portion 603, a width (or a size) W4 of each of the plurality of second portions 603b may progressively decrease in a direction from a center portion to both peripheries (or both ends) of the piezoelectric vibration portion 603 or the vibration apparatus 600.

According to an embodiment of the present disclosure, a second portion 603b, having a largest width W4 among the plurality of second portions 603b, may be located at a portion at which a highest stress may concentrate when the piezoelectric vibration portion 603 or the vibration apparatus 600 is vibrating in a vertical direction Z (or a thickness direction). A second portion 603b, having a smallest width W4 among the plurality of second portions 603b, may be located at a portion where a relatively low stress may occur when the piezoelectric vibration portion 603 or the vibration apparatus 600 is vibrating in the vertical direction Z. For example, the second portion 603b, having the largest width W4 among the plurality of second portions 603b, may be disposed at the center portion of the piezoelectric vibration portion 603, and the second portion 603b, having the smallest width W4 among the plurality of second portions 603b may be disposed at the both edges or peripheries of the piezoelectric vibration portion 603. Therefore, when the piezoelectric vibration portion 603 or the vibration apparatus 600 is vibrating in the vertical direction Z, interference of a sound wave or overlapping of a resonance frequency, occurring in the portion on which the highest stress concentrates, may be reduced or minimized. Thus, dipping phenomenon of a sound pressure level occurring in the low-pitched sound band may be reduced, thereby improving flatness of a sound characteristic in the low-pitched sound band. For example, flatness of a sound characteristic may be a level of a deviation between a highest sound pressure and a lowest sound pressure.

In the piezoelectric vibration portion 603, each of the plurality of first portions 603a may have different sizes (or widths). For example, a size (or a width) of each of the plurality of first portions 603a may progressively decrease or increase in a direction from the center portion to the both peripheries (or both ends) of the piezoelectric vibration portion 603 or the vibration apparatus 600. For example, in the piezoelectric vibration portion 603, a sound pressure level characteristic of a sound may be enhanced and a sound reproduction band may increase, based on various natural vibration frequencies according to a vibration of each of the plurality of first portions 603a having different sizes.

Each of the plurality of second portions 603b may be disposed between the plurality of first portions 603a. Therefore, in the piezoelectric vibration portion 603 or the vibration apparatus 600, vibration energy by a link in a unit lattice of the first portion 603a may increase by a corresponding second portion 603b. Thus, a vibration may increase, and a piezoelectric characteristic and flexibility may be secured. For example, the second portion 603b may include at least one or more of an epoxy-based polymer, an acryl-based polymer, and a silicone-based polymer, but embodiments of the present disclosure are not limited thereto.

The plurality of second portions 603b according to an embodiment of the present disclosure may be configured as an organic material portion. For example, the organic material portion may be disposed between the inorganic material portions and may absorb an impact applied to the inorganic material portion (or the first portion), may release a stress concentrating on the inorganic material portion to enhance the total durability of the piezoelectric vibration portion 603 or the vibration apparatus 600, and may provide flexibility to the piezoelectric vibration portion 603 or the vibration apparatus 600.

The plurality of second portions 603b according to an embodiment of the present disclosure may have modulus and viscoelasticity that are lower than those of the first portion 603a, and thus, the second portion 603b may enhance the reliability of the first portion 603a vulnerable to an impact due to a fragile characteristic. For example, the second portion 603b may include a material having a loss coefficient of about 0.01 to about 1.0 and modulus of about 0.1 [GPa] to about 10 [GPa].

The organic material portion included in the second portion 603b may include one or more of an organic material, an organic polymer, an organic piezoelectric material, and an organic non-piezoelectric material that has a flexible characteristic in comparison with the inorganic material portion of the first portions 603a. For example, the second portion 603b may be referred to as an adhesive portion, an elastic portion, a bending portion, a damping portion, or a flexible portion having flexibility, but embodiments of the present disclosure are not limited thereto.

The plurality of first portions 603a and the second portion 603b may be disposed on (or connected to) the same plane, and thus, the piezoelectric vibration portion 603 of the vibration array 210 according to various embodiments of the present disclosure may have a single thin film-type. For example, the piezoelectric vibration portion 603 may have a structure in which a plurality of first portions 603a are connected to one side. For example, the plurality of first portions 603a may have a structure connected to a whole the piezoelectric vibration portion 603. For example, the piezoelectric vibration portion 603 may be vibrated in a vertical direction (or a thickness direction) by the first portion 603a having a vibration characteristic and may be bent in a curved shape by the second portion 603b having flexibility. Also, in the piezoelectric vibration portion 603 according to various embodiments of the present disclosure, a size of the first portion 603a and a size of the second portion 603b may be adjusted based on a piezoelectric characteristic and flexibility needed for the piezoelectric vibration portion 603 or the vibration apparatus 600. For example, when the piezoelectric vibration portion 603 needs a piezoelectric characteristic rather than flexibility, a size of the first portion 603a may be adjusted to be greater than that of the second portion 603b. As another example, when the piezoelectric vibration portion 603 needs flexibility rather than a piezoelectric characteristic, a size of the second portion 603b may be adjusted to be greater than that of the first portion 603a. For example, the size of the second portion 603b and the size of the first portion 603a may be one or more of a width, a length, and a thickness. Accordingly, a size of the piezoelectric vibration portion 603 may be adjusted based on a characteristic needed therefor, and thus, the piezoelectric vibration portion 603 may be easy to design.

The first electrode portion E1 may be disposed at a first surface (or an upper surface) of the piezoelectric vibration portion 603. The first electrode portion E1 may be disposed at or coupled to a first surface of each of a plurality of first portions 603a and a first surface of each of a plurality of second portions 603b in common and may be electrically connected to the first surface of each of the plurality of first portions 603a. For example, the first electrode portion E1 may be a single-body electrode type which is disposed at a whole first surface of the piezoelectric vibration portion 603. For example, the first electrode portion E1 may have the same shape as that of the piezoelectric vibration portion 603, but embodiments of the present disclosure are not limited thereto. The first electrode portion E1 according to an embodiment of the present disclosure, as described above with reference to FIG. 35, may include a transparent conductive material, a semitransparent conductive material, or an opaque conductive material.

The second electrode portion E2 may be disposed at a second surface (or a rear surface) opposite to the first surface of the piezoelectric vibration portion 603. The second electrode portion E2 may be disposed at or coupled to a second surface of each of a plurality of first portions 603a and the second surface of each of a plurality of second portions 603b in common and may be electrically connected to a second surface of each of the plurality of first portions 603a. For example, the second electrode portion E2 may be a single-body electrode type which is disposed on a whole second surface of the piezoelectric vibration portion 603. For example, the second electrode portion E2 may have the same shape as that of the piezoelectric vibration portion 603, but embodiments of the present disclosure are not limited thereto. The second electrode portion E2 according to an embodiment of the present disclosure, as described above with reference to FIG. 35, may include a transparent conductive material, a semitransparent conductive material, or an opaque conductive material.

The piezoelectric vibration portion 603 may be polarized (or poling) by a certain voltage applied to the first electrode portion E1 and the second electrode portion E2 in a certain temperature atmosphere, or a temperature atmosphere that may be changed from a high temperature to a room temperature, but embodiments of the present disclosure are not limited thereto. For example, the piezoelectric vibration portion 603 may alternately and repeatedly contract and expand based on an inverse piezoelectric effect according to a sound signal (or voice signal) applied to the first electrode portion E1 and the second electrode portion E2 from the outside to vibrate. For example, the piezoelectric vibration portion 603 may vibrate based on a vertical-direction (or a thickness direction Z) vibration d33 and a horizontal-direction (or a planar direction) vibration d31 by the first electrode portion E1 and the second electrode portion E2. The piezoelectric vibration portion 603 may increase the displacement of the display panel (or the vibration plate) by contraction and expansion in the horizontal-direction, thereby further improving the vibration.

According to an embodiment of the present disclosure, the vibration apparatus 600 may include a plurality of inorganic material portion having a piezoelectric characteristic and an organic material portion between the plurality of inorganic material portion. For example, the vibration apparatus 600 may include a plurality of inorganic material portion having a piezoelectric characteristic and an organic material portion connected between the plurality of inorganic material portion.

According to an embodiment of the present disclosure, any one of the first electrode portion E1 and the second electrode portion E2 may be attached or coupled to the display apparatus by an adhesive member.

The vibration apparatus 600 according to an embodiment of the present disclosure may further include a first protection member and a second protection member.

The first protection member may be disposed at the first electrode portion E1 and may protect the first electrode portion E1. For example, the first protection member may include a plastic material, a fiber material, or a wood material.

The second protection member may be disposed at the second electrode portion E2 and may protect the second electrode portion E2. For example, the second protection member may include a plastic material, a fiber material, or a wood material. For example, the first protection member may include a material which is the same as or different from that of the second protection member. Any one of the first protection member and the second protection member may be attached or coupled to the display panel (or the vibration plate) by an adhesive member.

Figure 37:
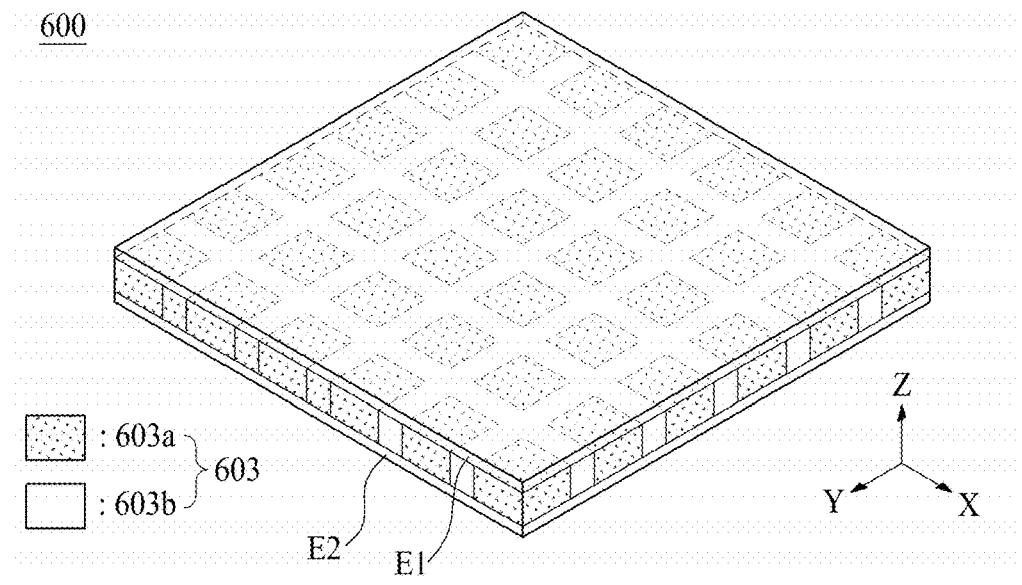
FIG. 37 illustrates a vibration apparatus according to another embodiment of the present disclosure.

FIG. 37 illustrates a vibration apparatus according to another embodiment of the present disclosure. FIG. 37 illustrates an embodiment where the piezoelectric vibration portion illustrated in FIG. 35 is modified. Hereinafter, therefore, repetitive descriptions of elements other than the piezoelectric vibration portion may be omitted or will be briefly given.

With reference to FIG. 37, in the vibration apparatus 600 according to another embodiment of the present disclosure, the piezoelectric vibration portion 603 may include a plurality of first portions 603a, which are spaced apart from one another along a first direction X and a second direction Y, and a second portion 603b disposed between the plurality of first portions 603a.

Each of the plurality of first portions 603a may be disposed to be spaced apart from one another along each of the first direction X and the second direction Y. For example, each of the plurality of first portions 603a may have a hexahedral shape (or a six-sided object shape) having the same size and may be disposed in a lattice shape. For example, each of the plurality of first portions 603a may include a piezoelectric material which is be substantially the same as the first portion 603a described above with reference to FIG. 36, and thus, like reference numerals refer to like elements and their repetitive descriptions may be omitted.

The second portion 603b may be disposed between the plurality of first portions 603a along each of the first direction X and the second direction Y. The second portion 603b may be configured to fill a gap or a space between two adjacent first portions 603a or to surround each of the plurality of first portions 603a, and thus, may be connected or attached to an adjacent first portion 603a. According to an embodiment of the present disclosure, a width of a second portion 603b disposed between two first portions 603a adjacent to each other along the first direction X may be the same as or different from that of the first portion 603a, and a width of a second portion 603b disposed between two first portions 603a adjacent to each other along the second direction Y may be the same as or different from that of the first portion 603a. For example, the second portion 603b may include an organic material which is be substantially the same as the second portion 603b described above with reference to FIG. 36, and thus, like reference numerals refer to like elements and their repetitive descriptions may be omitted.

Therefore, the piezoelectric vibration portion 603 of the vibration apparatus 600 may include a 1-3 composite structure and thus may have a resonance frequency of 30 MHz or less, but embodiments of the present disclosure are not limited thereto and a resonance frequency of the piezoelectric vibration portion 603 may vary based on one or more of a shape, a length, and a thickness.

Figure 38:
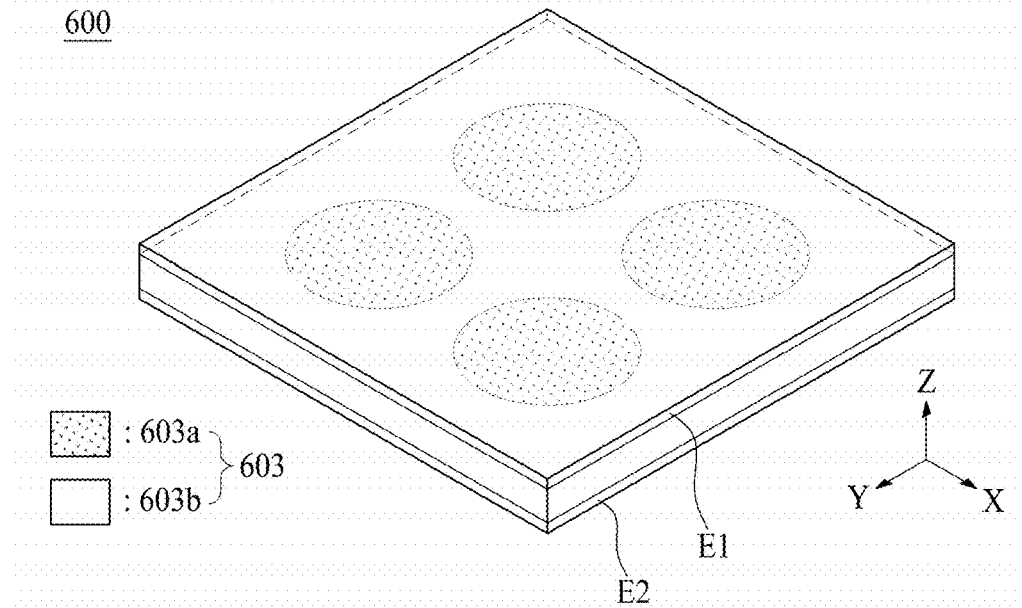
FIG. 38 illustrates a vibration apparatus according to another embodiment of the present disclosure.

FIG. 38 illustrates a vibration apparatus according to another embodiment of the present disclosure. FIG. 38 illustrates an embodiment where the piezoelectric vibration portion illustrated in FIG. 35 is modified. Hereinafter, therefore, repetitive descriptions of elements other than the piezoelectric vibration portion may be omitted or will be briefly given.

With reference to FIG. 38, in the vibration apparatus 600 according to another embodiment of the present disclosure, the piezoelectric vibration portion 603 may include a plurality of first portions 603a, which are spaced apart from one another along a first direction X and a second direction Y, and a second portion 603b disposed between the plurality of first portions 603a.

Each of the plurality of first portions 603a according to another embodiment of the present disclosure may have a flat structure of a circular shape. For example, each of the plurality of first portions 603a may have a circular plate shape, but embodiments of the present disclosure are not limited thereto. For example, each of the plurality of first portions 603a may have a dot shape including an oval shape, a polygonal shape, or a donut shape.

The second portion 603b may be disposed between the plurality of first portions 603a along each of the first direction X and the second direction Y. The second portion 603b may be configured to surround each of the plurality of first portions 603a, and thus, may be connected to or attached on a side surface of each of the plurality of first portions 603a. Each of the plurality of first portions 603a and the second portion 603b may be disposed (or arranged) in parallel on the same plane (or the same layer).

In the piezoelectric vibration portion 603 of the vibration apparatus 600 according to another embodiment of the present disclosure, each of the plurality of first portions 603a may have a flat structure of a triangular shape instead of a flat structure of a circular shape. For example, each of the plurality of first portions 603a may have a triangular plate shape.

According to an embodiment of the present disclosure, four adjacent first portions 603a among the plurality of first portions 603a may be adjacent to one another to form a tetragonal or quadrilateral shape (or a square shape). Vertices of the four adjacent first portions 603a forming a tetragonal shape may be adjacent to one another in a center portion (or a central portion) of the tetragonal shape.

According to another embodiment of the present disclosure, six adjacent first portions 603a among the plurality of first portions 603a may be adjacent to one another to form a hexagonal shape (or a regularly hexagonal shape). Vertices of the six adjacent first portions 603a forming a hexagonal shape may be adjacent to one another in a center portion (or a central portion) of the hexagonal shape.

The display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc. Also, the vibration apparatus according to the present disclosure may be applied to organic light emitting lighting apparatuses or inorganic light emitting lighting apparatuses. When the vibration apparatus of the present disclosure is applied to lighting apparatuses, the vibration apparatus may act as lighting and a speaker.

A display apparatus according to an embodiment of the present disclosure will be described below.

A display apparatus according to an embodiment of the present disclosure may include a display panel configured to display an image, a circuit part including a printed circuit board disposed spaced apart from a first portion of the display panel and connected to the display panel, a first vibration device disposed at a rear surface of the display panel, and a second vibration device disposed at a rear surface of the printed circuit board.

According to some embodiments of the present disclosure, the display apparatus may further include a first member configured to accommodate the display panel and the circuit part, and a second member disposed to cover one or more peripheries of a front surface of the display panel and an upper portion of the first member.

According to some embodiments of the present disclosure, the first vibration device may be configured to vibrate the display panel to generate a first sound, and the second vibration device may be configured to vibrate the printed circuit board to generate a second sound.

According to some embodiments of the present disclosure, the second sound may have a frequency of a pitched sound band which differs from that of the first sound.

According to some embodiments of the present disclosure, the second sound may have a frequency of a pitched sound band which is same as that of the first sound.

According to some embodiments of the present disclosure, the first sound may be configured to output in a forward direction of the display panel, and the second sound may be configured to output in a forward-upward direction of the display panel.

According to some embodiments of the present disclosure, the printed circuit board may be disposed at an angle with respect to the display panel.

According to some embodiments of the present disclosure, the printed circuit board may be provided in plurality, and the plurality of printed circuit boards may be arranged at a certain interval along the first portion of the display panel, and the plurality of printed circuit boards may be disposed toward a forward-upward direction of the display panel at the same angle, or be disposed toward the forward-upward direction of the display panel at different angles.

According to some embodiments of the present disclosure, the first member may include a first structure disposed at a rear surface of the display panel and a rear surface of the circuit part, and the first structure may include a $1\text{-}1^{st}$ structure disposed to correspond to the display panel, and a $1\text{-}2^{nd}$ structure disposed at a certain angle with respect to the $1\text{-}1^{st}$ structure to correspond to the printed circuit board.

According to some embodiments of the present disclosure, the $1\text{-}2^{nd}$ structure may extend from the $1\text{-}1^{st}$ structure and may be bent in a forward-upward direction of the display panel.

According to some embodiments of the present disclosure, the display apparatus may further include a hinge portion disposed between the $1\text{-}1^{st}$ structure and the $1\text{-}2^{nd}$ structure, each of one side of the $1\text{-}1^{st}$ structure and one side of the $1\text{-}2^{nd}$ structure may be connected to the hinge portion, and the $1\text{-}2^{nd}$ structure may be rotatable in the forward-upward direction of the display panel with respect to the hinge portion.

According to some embodiments of the present disclosure, a region of the second member overlapping the display panel may be spaced apart from the display panel.

According to some embodiments of the present disclosure, a region of the second member overlapping the display panel may be spaced apart from the display panel with a height configured to prevent the display panel from contacting the second member when the $1\text{-}2^{nd}$ structure is rotating.

According to some embodiments of the present disclosure, the display apparatus may further include a third member disposed at a front surface of the display panel, a region of the second member overlapping the third member may be spaced apart from the third member.

According to some embodiments of the present disclosure, the display apparatus may further include a third member disposed at a front surface of the display panel, a region of the second member overlapping the third member may be spaced apart from the third member with a height configured to prevent the third member from contacting the first member when the $1\text{-}2^{nd}$ structure is rotating.

According to some embodiments of the present disclosure, the first member may include a groove configured to accommodate each of the first and second vibration devices.

According to some embodiments of the present disclosure, the display apparatus may further include a plate disposed at the printed circuit board, the plate may be disposed at a region other than a mount region and a vibration device disposition region.

According to some embodiments of the present disclosure, the display apparatus may further include a first pattern disposed at the printed circuit board, the first pattern may include at least one or more grooves, holes, or protrusions.

According to some embodiments of the present disclosure, the first pattern may be disposed to surround the second vibration device.

According to some embodiments of the present disclosure, the first pattern may include different shapes of at least two or more among the one or more grooves, holes, or protrusions.

According to some embodiments of the present disclosure, each of the first vibration device and the second vibration device may include a piezoelectric vibration portion, and the piezoelectric vibration portion may include a plurality of inorganic material portions having a piezoelectric characteristic, and an organic material portion between the plurality of inorganic material portions.

According to some embodiments of the present disclosure, the organic material portion may be provided in plurality, and the plurality of organic material portions and the plurality of inorganic material portions may be alternately and repeatedly arranged.

According to some embodiments of the present disclosure, a width of each of the plurality of organic material portions may progressively decrease in a direction from a center portion to both peripheries of the piezoelectric vibration portion.

According to some embodiments of the present disclosure, the printed circuit board may include a first printed circuit board including a first periphery connected to the display panel, a second printed circuit board connected to a first portion of the first printed circuit board by a first connection member, a third vibration device being disposed at the second printed circuit board, and a third printed circuit board connected to a second portion of the first printed circuit board by a second connection member, a fourth vibration device being disposed at the third printed circuit board.

According to some embodiments of the present disclosure, the first connection member and the second connection member may be bent to a front surface and a rear surface of the first printed circuit board.

According to some embodiments of the present disclosure, the second printed circuit board and the third printed circuit board may be disposed toward a left-forward direction of the display panel or a right-forward direction of the display panel.

According to some embodiments of the present disclosure, the first printed circuit board may be provided in plurality, and the plurality of first printed circuit boards may be arranged at a certain interval along the first portion of the display panel, and the second printed circuit board and the third printed circuit board may be respectively disposed at first printed circuit boards disposed at both sides among the plurality of first printed circuit boards.

According to some embodiments of the present disclosure, the second printed circuit board may be disposed at the left side of a first printed circuit board disposed at a left side among the plurality of first printed circuit boards with respect to a forward direction of the display panel, and the third printed circuit board may be disposed at the right side of the first printed circuit board disposed at a right side among the plurality of first printed circuit boards.

According to some embodiments of the present disclosure, each of the third vibration device and the fourth vibration device may include a piezoelectric vibration portion, and the piezoelectric vibration portion may include a plurality of inorganic material portions having a piezoelectric characteristic, and an organic material portion between the plurality of inorganic material portions.

According to some embodiments of the present disclosure, the display apparatus may further include a fourth member disposed at a rear surface of the printed circuit board; and a fifth member disposed at a rear surface of the fourth member, the second vibration device may be disposed at the fifth member.

According to some embodiments of the present disclosure, the printed circuit board may be configured to vibrate based on a vibration of the second vibration device to generate a sound, and the vibration of the second vibration device may be transferred to the printed circuit board along the fourth member and the fifth member.

According to some embodiments of the present disclosure, the fourth member may include a first region at a rear surface of the printed circuit board, and a second region extending from the first region, the fifth member being disposed at the second region.

According to some embodiments of the present disclosure, the fifth member may include a first portion disposed at a rear surface of the first region of the fourth member, a second portion disposed at a rear surface of the second region of the fourth member, and a third portion between the first portion and the second portion, the second vibration device being disposed at the third portion.

According to some embodiments of the present disclosure, the third portion may have a curvature and may be concave toward the fourth member.

According to some embodiments of the present disclosure, the second vibration device may be disposed to have a shape corresponding to that of the third portion.

According to some embodiments of the present disclosure, the third portion may be configured to vibrate based on a vibration of the second vibration device to generate a sound.

According to some embodiments of the present disclosure, the third portion may further include a second pattern.

According to some embodiments of the present disclosure, the second pattern may include a plurality of grooves arranged to have a line shape, a stripe shape, or a diagonal shape.

According to some embodiments of the present disclosure, the second pattern may include a plurality of groups, and one or more of a depth, a width, and an interval of a second pattern included in one group among the plurality of groups may be the same, and one or more of depths, widths, and intervals of second patterns included in different groups among the plurality of groups may be differ.

It will be apparent to those skilled in the art that various modifications and variations can be made in the display apparatus of the present disclosure without departing from the technical idea or scope of the disclosures. Thus, it may be intended that embodiments of the present disclosure cover the modifications and variations of the disclosure provided they come within the scope of the appended claims and their equivalents.

What is claimed is:
1. A display apparatus, comprising:
a display panel configured to display an image;
a circuit part including a printed circuit board disposed spaced apart from a first portion of the display panel and connected to the display panel;
a first vibration device disposed at a rear surface of the display panel;
a second vibration device disposed at a rear surface of the printed circuit board; and
a first member configured to accommodate the display panel and the circuit part,
wherein:
the first member comprises a first structure disposed at the rear surface of the display panel and a rear surface of the circuit part, and
the first structure comprises:
a $1\text{-}1^{st}$ structure disposed to correspond to the display panel; and
a $1\text{-}2^{nd}$ structure disposed at a certain angle with respect to the $1\text{-}1^{th}$ structure to correspond to the printed circuit board.
2. The display apparatus of claim 1, further comprising:
a second member disposed to cover one or more peripheries of a front surface of the display panel and an upper portion of the first member.
3. The display apparatus of claim 1, wherein:
the first vibration device is configured to vibrate the display panel to generate a first sound, and
the second vibration device is configured to vibrate the printed circuit board to generate a second sound.

4. The display apparatus of claim 3, wherein the second sound has a frequency of a pitched sound band which differs from that of the first sound.

5. The display apparatus of claim 3, wherein the second sound has a frequency of a pitched sound band which is same as that of the first sound.

6. The display apparatus of claim 3, wherein:
the first sound is configured to output in a forward direction of the display panel, and
the second sound is configured to output in a forward-upward direction of the display panel.

7. The display apparatus of claim 1, wherein the printed circuit board is disposed at an angle with respect to the display panel.

8. The display apparatus of claim 7, wherein:
the printed circuit board are provided in plurality, and the plurality of printed circuit boards are arranged at a certain interval along the first portion of the display panel, and
the plurality of printed circuit boards are disposed toward a forward-upward direction of the display panel at a same angle, or are disposed toward the forward-upward direction of the display panel at different angles.

9. The display apparatus of claim 1, wherein the $1\text{-}2^{nd}$ structure extends from the $1\text{-}1^{st}$ structure and is bent in a forward-upward direction of the display panel.

10. The display apparatus of claim 2, further comprising a hinge portion disposed between the $1\text{-}1^{st}$ structure and the $1\text{-}2^{nd}$ structure,
wherein each of one side of the $1\text{-}1^{st}$ structure and one side of the $1\text{-}2^{nd}$ structure is connected to the hinge portion, and the $1\text{-}2^{nd}$ structure is rotatable in a forward-upward direction of the display panel with respect to the hinge portion.

11. The display apparatus of claim 10, wherein a region of the second member overlapping the display panel is spaced apart from the display panel.

12. The display apparatus of claim 10, wherein a region of the second member overlapping the display panel is spaced apart from the display panel with a height configured to prevent the display panel from contacting the second member when the $1\text{-}2^{nd}$ structure is rotating.

13. The display apparatus of claim 10, further comprising a third member disposed at a front surface of the display panel,
wherein a region of the second member overlapping the third member is spaced apart from the third member.

14. The display apparatus of claim 10, further comprising a third member disposed at a front surface of the display panel,
wherein a region of the second member overlapping the third member is spaced apart from the third member with a height configured to prevent the third member from contacting the first member when the $1\text{-}2^{nd}$ structure is rotating.

15. The display apparatus of claim 1, wherein the first member comprises a groove configured to accommodate each of the first and second vibration devices.

16. The display apparatus of claim 1, further comprising a plate disposed at the printed circuit board,
wherein the plate is disposed at a region other than a mount region and a vibration device disposition region.

17. The display apparatus of claim 1, further comprising a first pattern disposed at the printed circuit board,
wherein the first pattern comprises at least one or more grooves, holes, or protrusions.

18. The display apparatus of claim 17, wherein the first pattern is disposed to surround the second vibration device.

19. The display apparatus of claim 17, wherein the first pattern comprises different shapes of at least two or more among the one or more grooves, holes, or protrusions.

20. The display apparatus of claim 1, wherein:
each of the first vibration device and the second vibration device comprises a piezoelectric vibration portion, and the piezoelectric vibration portion comprises:
a plurality of inorganic material portions having a piezoelectric characteristic; and
an organic material portion between the plurality of inorganic material portions.

21. The display apparatus of claim 20, wherein the organic material portion is provided in plurality, and the plurality of organic material portions and the plurality of inorganic material portions are alternately and repeatedly arranged.

22. The display apparatus of claim 21, wherein a width of each of the plurality of organic material portions progressively decrease in a direction from a center portion to both peripheries of the piezoelectric vibration portion.

23. A display apparatus, comprising:
a display panel configured to display an image;
a circuit part including a printed circuit board disposed spaced apart from a first portion of the display panel and connected to the display panel;
a first vibration device disposed at a rear surface of the display panel; and
a second vibration device disposed at a rear surface of the printed circuit board,
wherein the printed circuit board comprises:
a first printed circuit board including a first periphery connected to the display panel;
a second printed circuit board connected to a first portion of the first printed circuit board by a first connection member, a third vibration device being disposed at the second printed circuit board; and
a third printed circuit board connected to a second portion of the first printed circuit board by a second connection member, a fourth vibration device being disposed at the third printed circuit board.

24. The display apparatus of claim 23, wherein the first connection member and the second connection member are bent to a front surface and a rear surface of the first printed circuit board.

25. The display apparatus of claim 23, wherein the second printed circuit board and the third printed circuit board are disposed toward a left-forward direction of the display panel or a right-forward direction of the display panel.

26. The display apparatus of claim 23, wherein:
the first printed circuit board is provided in plurality, and the plurality of first printed circuit boards are arranged at a certain interval along the first portion of the display panel, and
the second printed circuit board and the third printed circuit board are respectively disposed at first printed circuit boards disposed at both sides among the plurality of first printed circuit boards.

27. The display apparatus of claim 26, wherein:
the second printed circuit board is disposed at a left side of a first printed circuit board disposed at a left side among the plurality of first printed circuit boards with respect to a forward direction of the display panel, and
the third printed circuit board is disposed at a right side of the first printed circuit board disposed at a right side among the plurality of first printed circuit boards.

28. The display apparatus of claim 23, wherein:
each of the third vibration device and the fourth vibration device comprises a piezoelectric vibration portion, and the piezoelectric vibration portion comprises:
a plurality of inorganic material portions having a piezoelectric characteristic; and
an organic material portion between the plurality of inorganic material portions.

29. The display apparatus of claim 1, further comprising:
a fourth member disposed at a rear surface of the printed circuit board; and
a fifth member disposed at a rear surface of the fourth member,
wherein the second vibration device is disposed at the fifth member.

30. The display apparatus of claim 29, wherein the printed circuit board is configured to vibrate based on a vibration of the second vibration device to generate a sound, and the vibration of the second vibration device is transferred to the printed circuit board along the fourth member and the fifth member.

31. The display apparatus of claim 29, wherein the fourth member comprises:
a first region at a rear surface of the printed circuit board; and
a second region extending from the first region, the fifth member being disposed at the second region.

32. The display apparatus of claim 31, wherein the fifth member comprises:
a first portion disposed at a rear surface of the first region of the fourth member;
a second portion disposed at a rear surface of the second region of the fourth member; and
a third portion between the first portion and the second portion, the second vibration device being disposed at the third portion.

33. The display apparatus of claim 32, wherein the third portion has a curvature and is concave toward the fourth member.

34. The display apparatus of claim 33, wherein the second vibration device is disposed to have a shape corresponding to that of the third portion.

35. The display apparatus of claim 32, wherein the third portion is configured to vibrate based on a vibration of the second vibration device to generate a sound.

36. The display apparatus of claim 32, wherein the third portion further comprises a second pattern.

37. The display apparatus of claim 36, wherein the second pattern comprises a plurality of grooves arranged to have a line shape, a stripe shape, or a diagonal shape.

38. The display apparatus of claim 36, wherein:
the second pattern comprises a plurality of groups, and
one or more of a depth, a width, and an interval of a second pattern included in one group among the plurality of groups are same, and one or more of depths, widths, and intervals of second patterns included in different groups among the plurality of groups differ.

* * * * *